US012635209B2

(12) United States Patent
Hsiung et al.

(10) Patent No.: US 12,635,209 B2
(45) Date of Patent: May 19, 2026

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Te-Chih Hsiung, Taipei City (TW); Yun-Hua Chen, Hsinchu County (TW); Bing-Sian Wu, Hsinchu City (TW); Yi-Hsuan Chiu, Hsinchu City (TW); Yu-Wei Chang, Hsinchu City (TW); Wen-Kuo Hsieh, Taipei City (TW); Chih-Yuan Ting, Taipei City (TW); Huan-Just Lin, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 465 days.

(21) Appl. No.: 18/180,720

(22) Filed: Mar. 8, 2023

(65) Prior Publication Data

US 2024/0120203 A1 Apr. 11, 2024

Related U.S. Application Data

(60) Provisional application No. 63/378,370, filed on Oct. 5, 2022.

(51) Int. Cl.
*H01L 21/768* (2006.01)
*H01L 21/28* (2006.01)
(Continued)

(52) U.S. Cl.
CPC ... *H01L 21/28123* (2013.01); *H10D 30/6219* (2025.01); *H10D 62/151* (2025.01); *H10D 64/017* (2025.01); *H10D 84/017* (2025.01); *H10D 84/0172* (2025.01); *H10D 84/0186* (2025.01); *H10D 84/0188* (2025.01); *H10D 84/0193* (2025.01); *H10D 84/038* (2025.01); *H10D 84/853* (2025.01)

(58) Field of Classification Search
None
See application file for complete search history.

(56) References Cited

U.S. PATENT DOCUMENTS 9,105,490 B2 8/2015 Wang et al.
9,236,267 B2 1/2016 De et al.
(Continued)

*Primary Examiner* — Shahed Ahmed
*Assistant Examiner* — Lamont B Koo
(74) *Attorney, Agent, or Firm* — Birch, Stewart, Kolasch & Birch, LLP

(57) ABSTRACT

A method includes forming a dummy gate over a semiconductor fin; forming a source/drain epitaxial structure over the semiconductor fin and adjacent to the dummy gate; depositing an interlayer dielectric (ILD) layer to cover the source/drain epitaxial structure; replacing the dummy gate with a gate structure; forming a dielectric structure to cut the gate structure, wherein a portion of the dielectric structure is embedded in the ILD layer; recessing the portion of the dielectric structure embedded in the ILD layer; after recessing the portion of the dielectric structure, removing a portion of the ILD layer over the source/drain epitaxial structure; and forming a source/drain contact in the ILD layer and in contact with the portion of the dielectric structure.

20 Claims, 36 Drawing Sheets

(51) Int. Cl.

| | |
|---|---|
| *H10D 30/62* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10D 84/85* | (2025.01) |

(56)                    References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2020/0075421 | A1* | 3/2020 | Wu ................... H01L 21/76877 |
| 2021/0118875 | A1* | 4/2021 | Wu ................... H10D 84/0151 |

* cited by examiner

100

180

240
190

240

IV

190

III

180

V

V

II

II

I

I 180
240

180

240

180

114

240

112

240

IV

III

114

X

Y

IV

IV

112

110

III

III

SEMICONDUCTOR DEVICE AND MANUFACTURING METHOD THEREOF

PRIORITY CLAIM AND CROSS-REFERENCE

This application claims priority to U.S. Provisional Application Ser. No. 63/378,370, filed Oct. 5, 2022, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
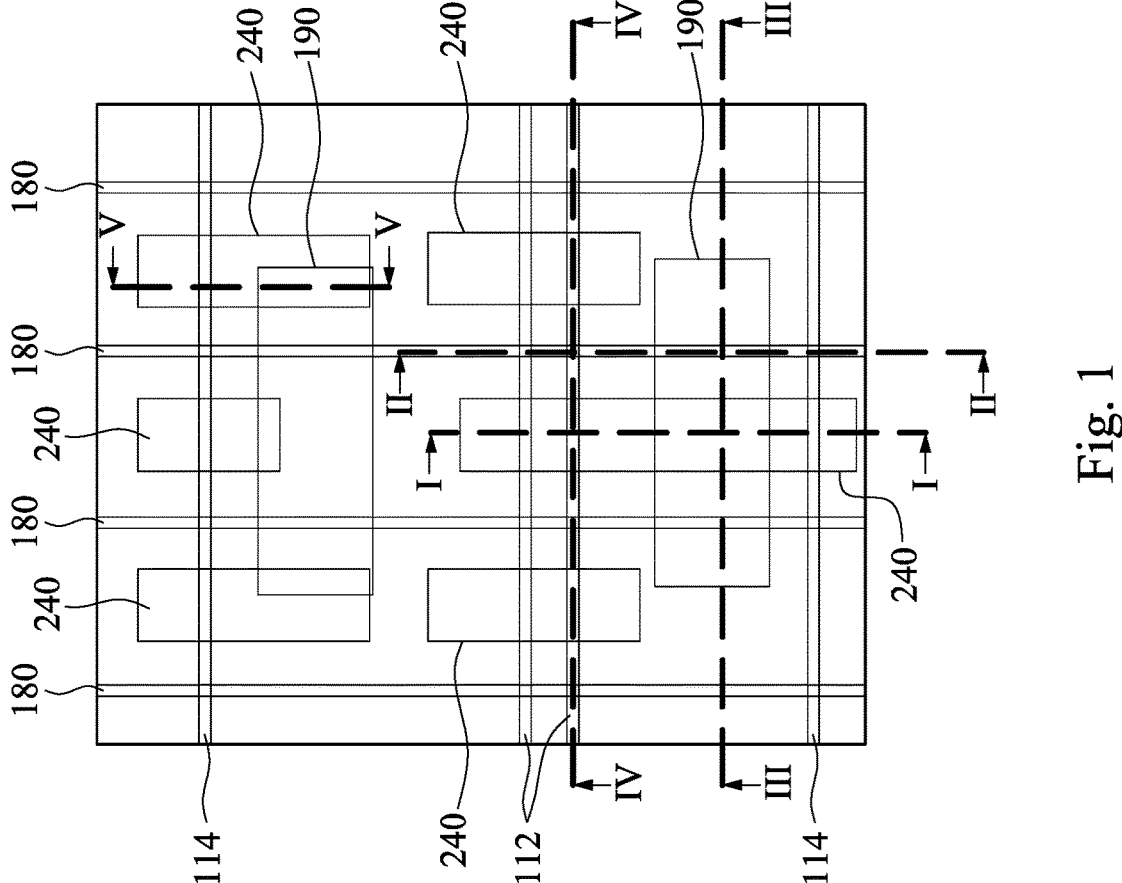
FIG. 1 is a layout diagram of a semiconductor device (or an integrated circuit structure) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "etch selectivity" refers to the ratio of the etch rates of two different materials under the same etching conditions. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region. As used herein, source/drain region(s) may refer to a source or a drain, individually or collectively dependent upon the context.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present disclosure is related to semiconductor devices (or integrated circuit structures) and methods of forming the same. More particularly, some embodiments of the present disclosure are related to semiconductor devices including cut-metal-gate dielectric plug. A portion of the cut-metal-gate dielectric plug directly adjacent to a source/drain epitaxial structure of the semiconductor device has a height lower than a height of a portion of the source/drain epitaxial structure having a maximum width. Such configuration reduces electrical resistance between the source/drain epitaxial structure and a source/drain contact connected thereto.

FIG. 1 is a layout diagram of a semiconductor device (or an integrated circuit structure) 100 in accordance with some embodiments, and FIGS. 2A-16D illustrate a method for manufacturing the semiconductor device (or the integrated circuit structure) 100 in FIG. 1 at various stages in accordance with some embodiments of the present disclosure. In some embodiments, the semiconductor device 100 shown in FIG. 1 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof. Further, the layout design of the semiconductor device 100 shown in FIG. 1 is illustrative, and should not limit the scope of the present disclosure.

FIGS. 2A, 3A, 4A, 5A, 6A, 7A, 8A, 9A, 10A, 11A, 12A, 13A, 14A, 15A, and 16A are cross-sectional view of some embodiments of the semiconductor device 100 during fabrication along a first cut (e.g., cut I-I). FIGS. 2B, 3B, 4B, 5B, 6B, 7B, 8B, 9B, and 10B are cross-sectional view of some embodiments of the semiconductor device 100 during fabrication along a second cut (e.g., cut II-II). FIGS. 2C, 3C, 4C, 5C, 6C, 7C, 8C, 9C, 10C, 11B, 12B, 13B, 14B, 15B, and 16C are cross-sectional view of some embodiments of the semiconductor device 100 during fabrication along a third cut (e.g., cut III-III). FIGS. 2D, 3D, 4D, 5D, 6D, 7D, 8D, 9D, 10D, 11C, 12C, 13C, 14C, 15C, and 16D are cross-sectional view of some embodiments of the semiconductor device 100 during fabrication along a fourth cut (e.g., cut IV-IV).

Figures 2A, 2B:
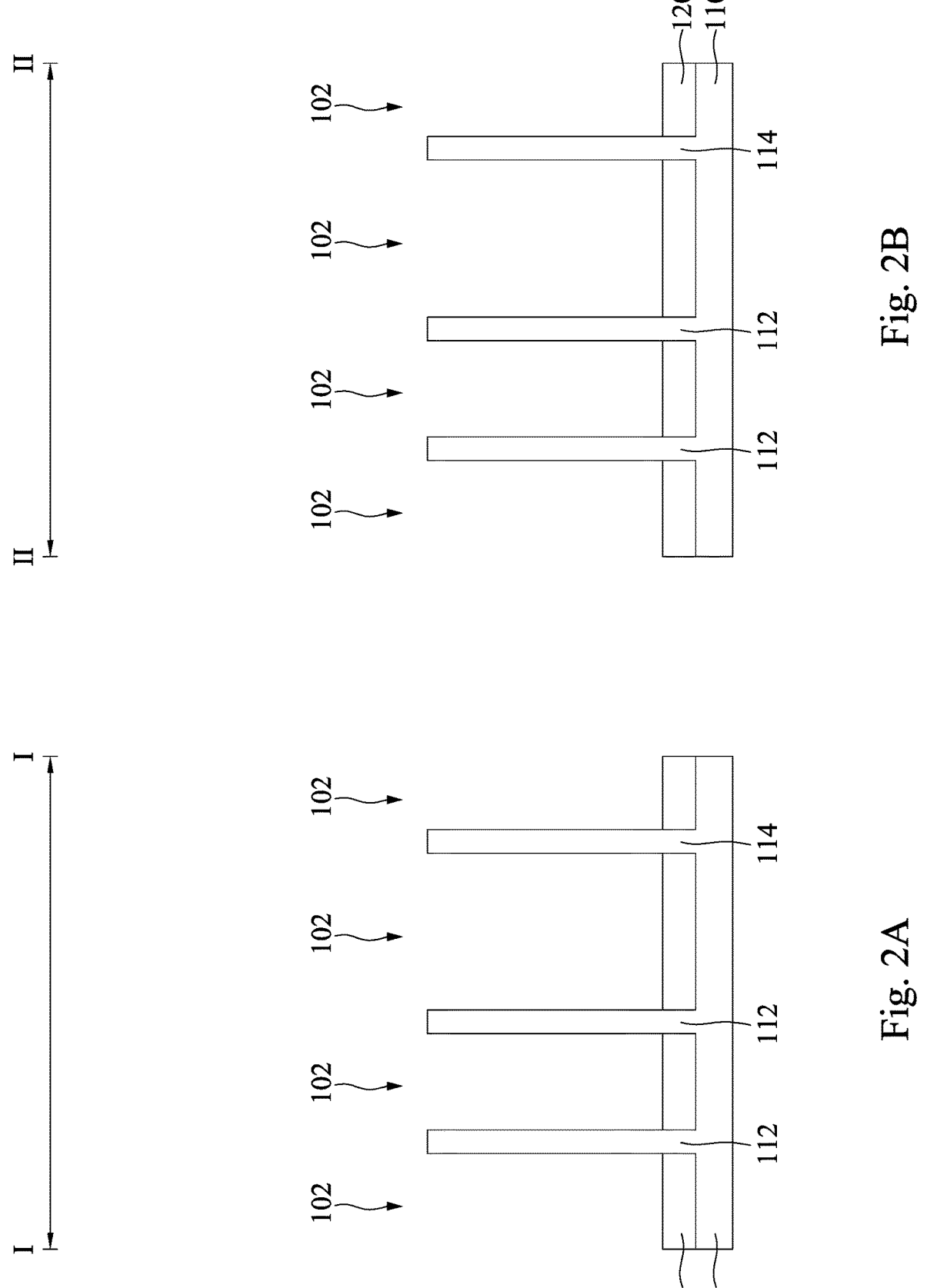
FIGS. 2A-16D illustrate a method for manufacturing the semiconductor device (or the integrated circuit structure) in FIG. 1 at various stages in accordance with some embodiments of the present disclosure.
Figure 2D:
Figure 2D:
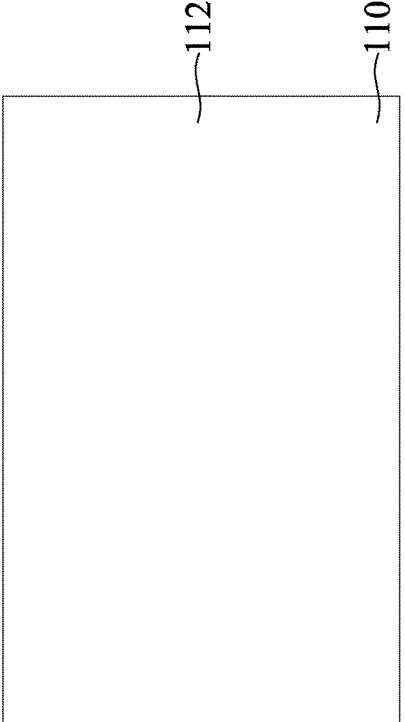
Figure 2C:
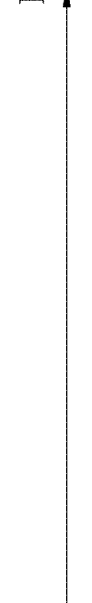
Figure 2C:
Figure 2C:
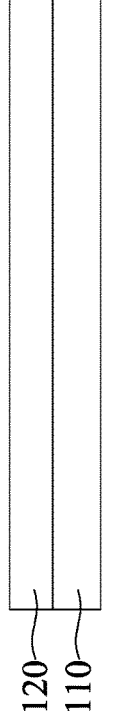
Figures 3A, 3B:
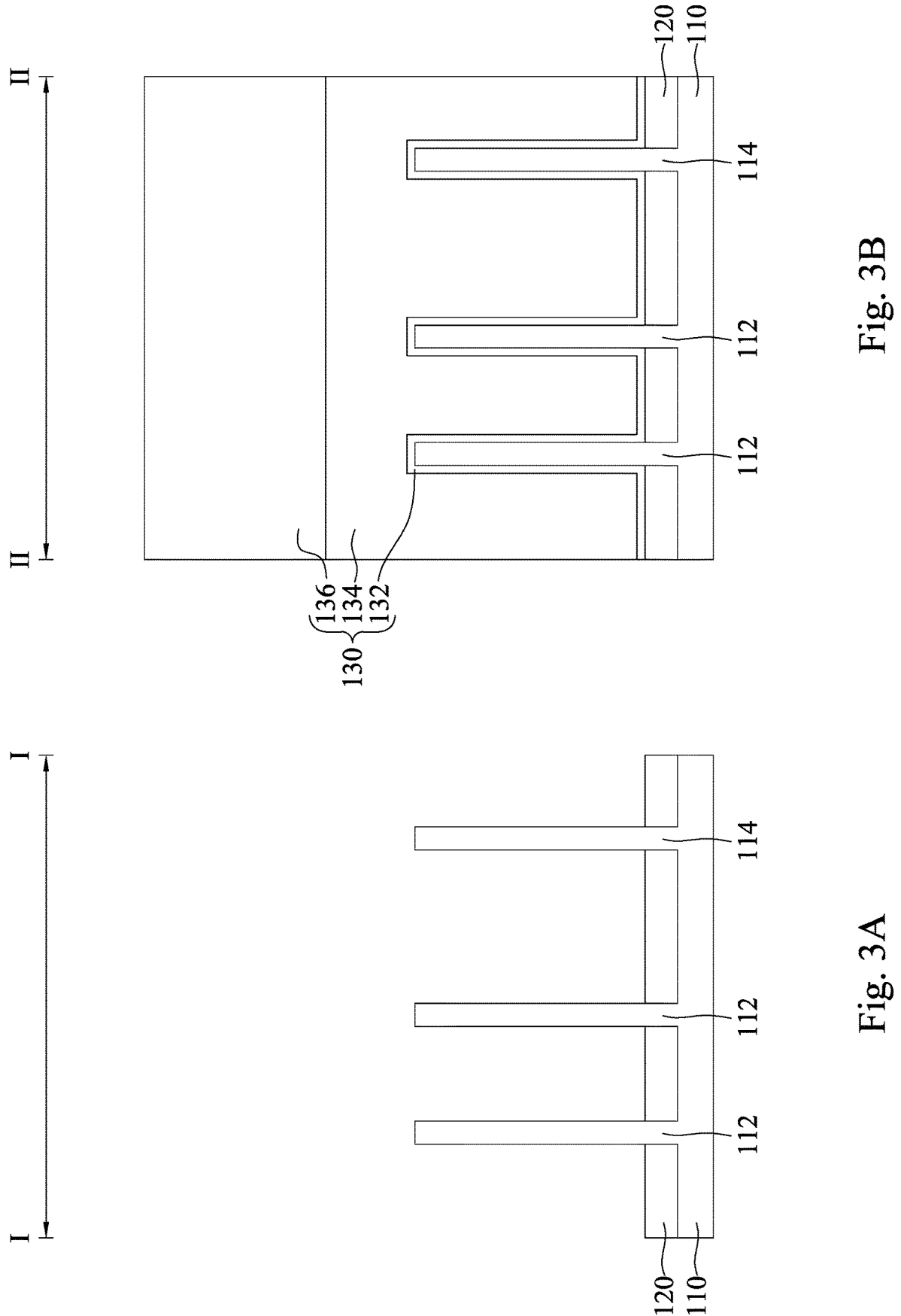
Figures 3C, 3D:
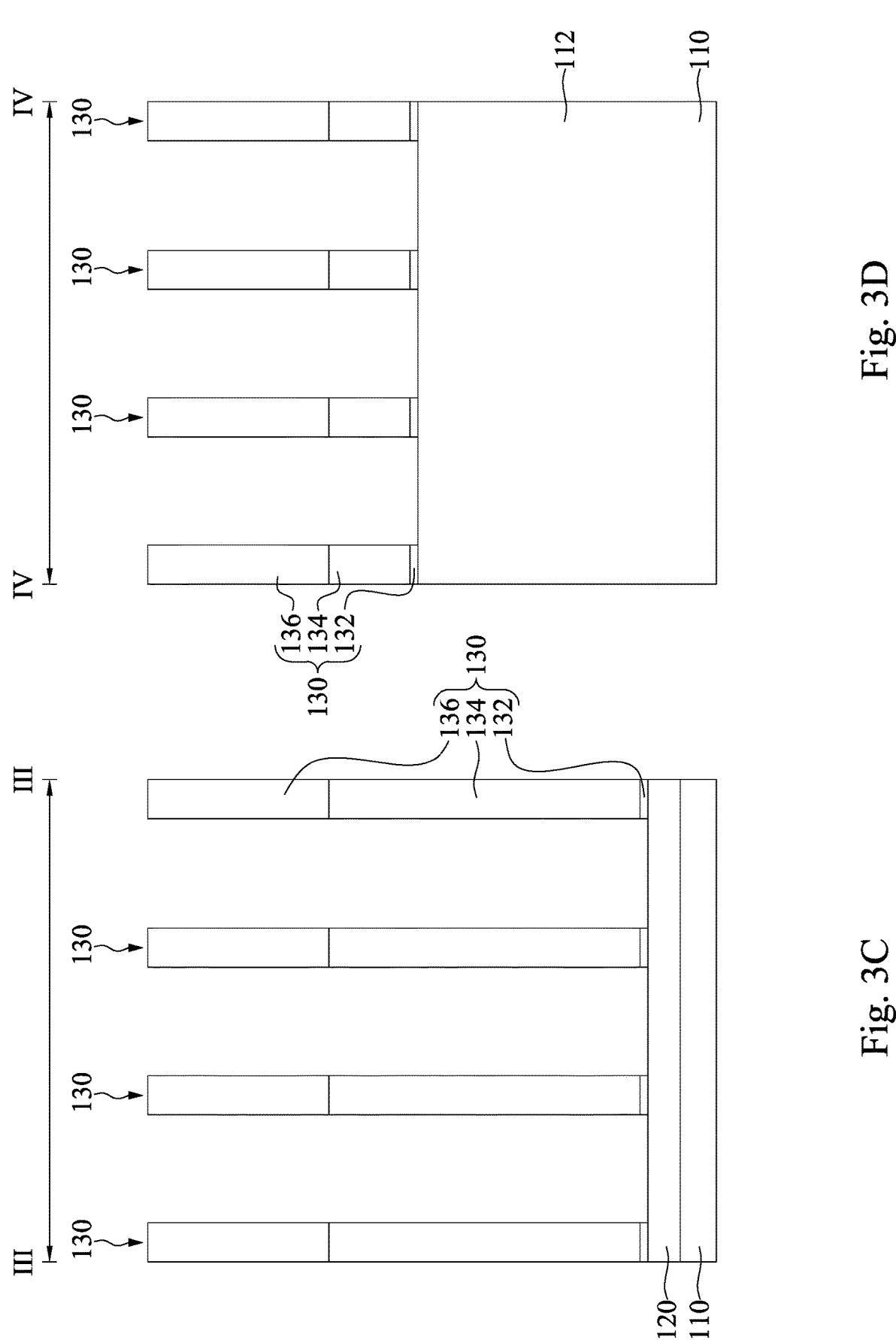
Figures 4A, 4B:
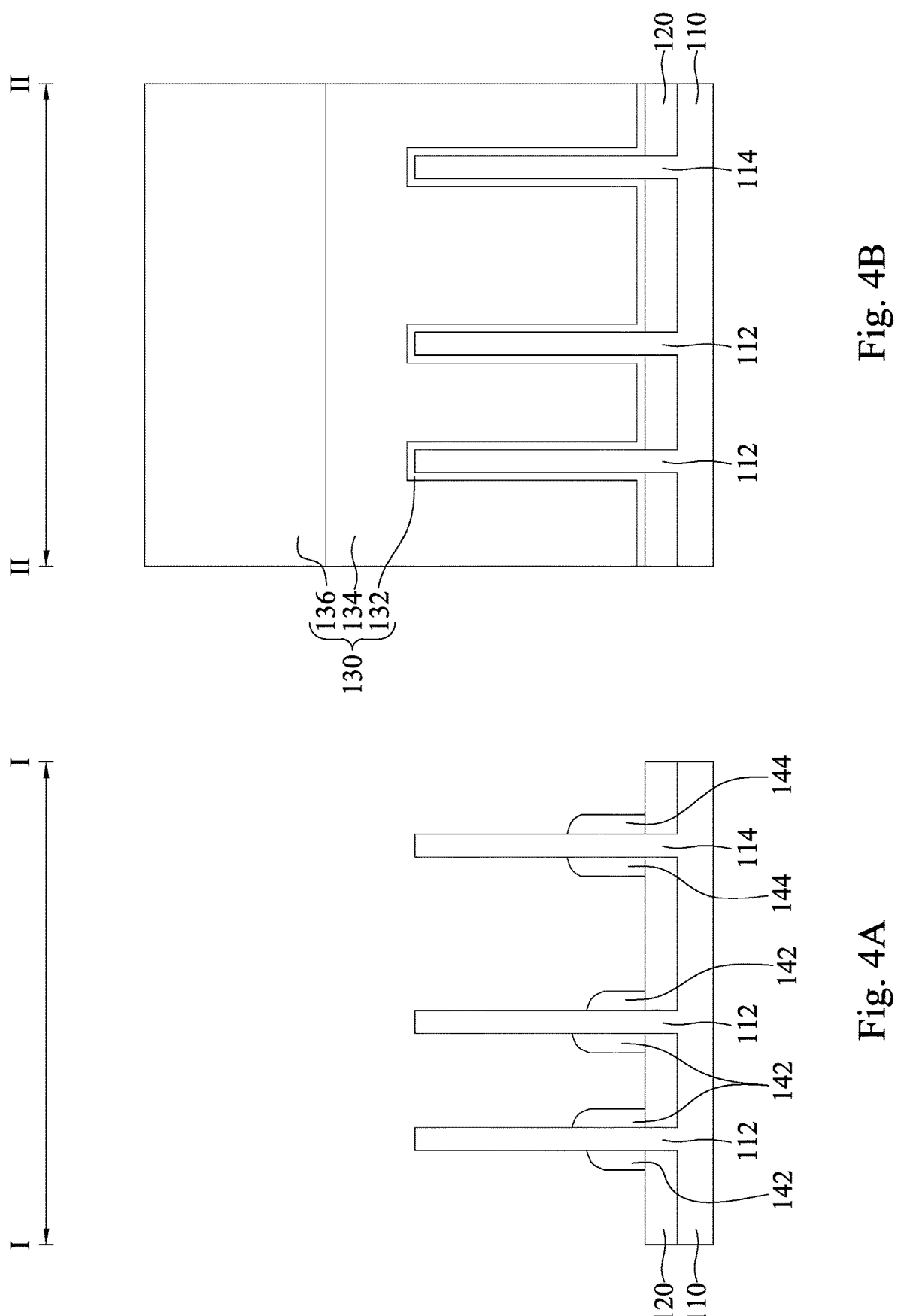
Figure 4D:
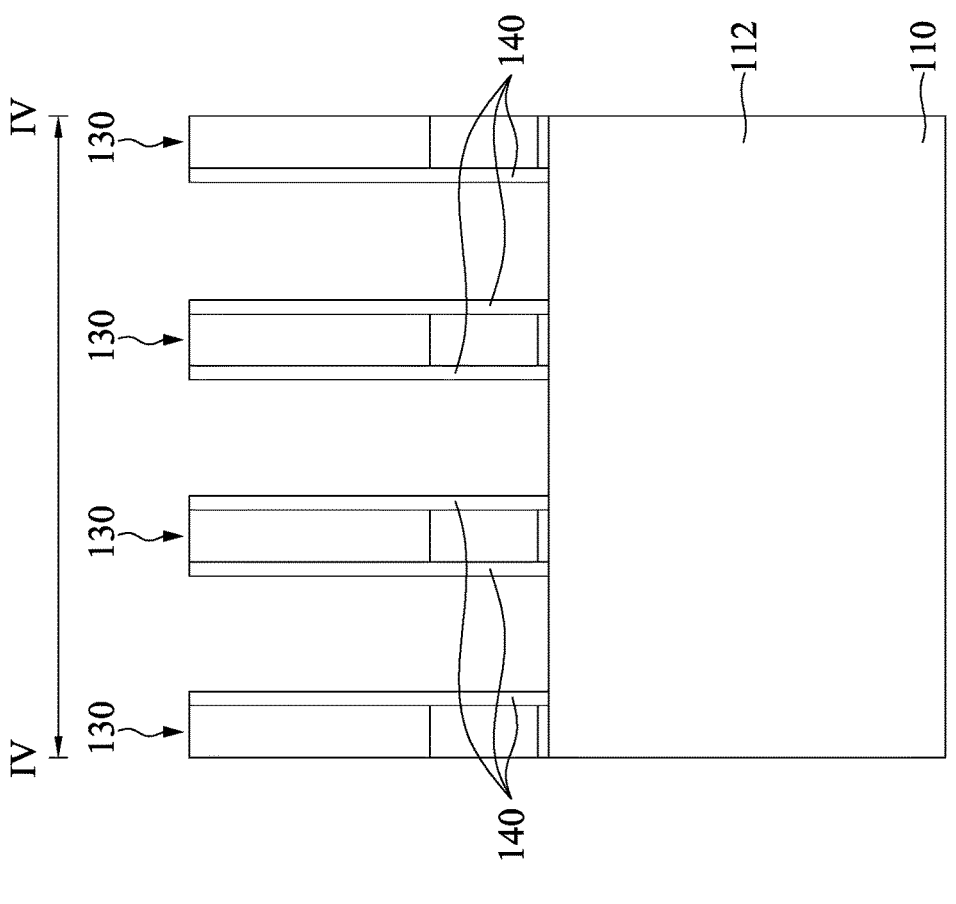
Figure 4C:
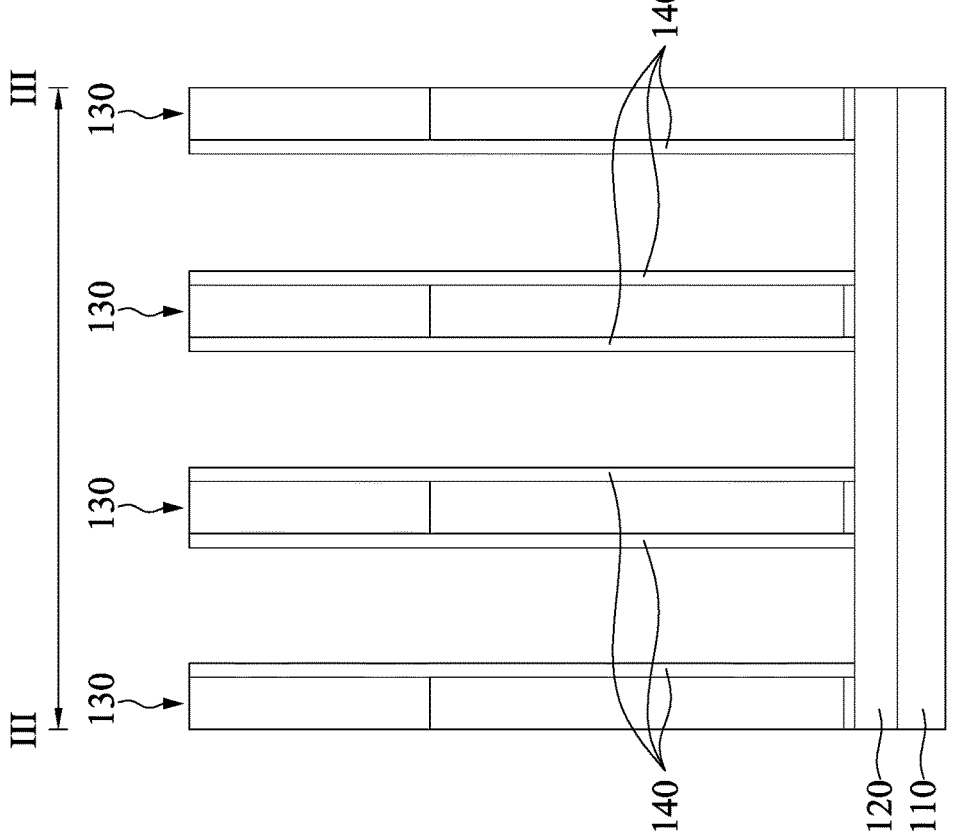

Reference is made to FIGS. 1-2D. A substrate 110 is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

One or more semiconductor fins 112 and 114 are formed on the substrate 110. The semiconductor fins 112 and 114 can be equivalently referred to as fin structures in some embodiments. The semiconductor fins 112 and 114 may be N-type or P-type. For example, the semiconductor fins 112 are N-type, and the semiconductor fins 114 are P-type. The semiconductor fins 112 and 114 may be formed using, for example, a patterning process to form trenches such that trenches are formed between adjacent semiconductor fins 112 and 114. As discussed in greater detail below, the semiconductor fins 112 and 114 will be used to form FinFETs. It is understood that two semiconductor fins 112 and 114 are illustrated for purposes of illustration, but other embodiments may include any number of semiconductor fins. In some embodiments, one or more dummy semiconductor fins are formed adjacent to the semiconductor fins 112 and 114.

The semiconductor fins 112 and 114 may be formed by performing an etching process to the substrate 110. Specifically, a patterned hard mask structure is formed over the substrate 110. In some embodiments, the patterned hard mask structure is formed of silicon nitride, silicon oxynitride, silicon carbide, silicon carbon-nitride, or the like. The patterned hard mask structure covers a portion of the substrate 110 while leaves another portion of the substrate 110 uncovered. The substrate 110 is then patterned using the patterned hard mask structure as a mask to form trenches 102. Accordingly, the semiconductor fins 112 and 114 are formed.

Isolation structures 120, such as shallow trench isolations (STI), are disposed in trenches 102 and over the substrate 110. The isolation structures 120 can be equivalently referred to as an isolation insulating layer in some embodiments. The isolation structures 120 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation structures 120 are formed through a process such as CVD, flowable CVD (FCVD), or a spin-on-glass process, although any acceptable process may be utilized. Subsequently, portions of the isolation structures 120 extending over the top surfaces of the semiconductor fins 112 and 114 are removed using, for example, an etching back process, chemical mechanical polishing (CMP), or the like.

The isolation structures 120 are then recessed to expose upper portions of the semiconductor fins 112 and 114. In some embodiments, the isolation structures 120 are recessed using a single etch processes, or multiple etch processes. In some embodiments in which the isolation structures 120 is made of silicon oxide, the etch process may be, for example, a dry etch, a chemical etch, or a wet cleaning process. For example, the chemical etch may employ fluorine-containing chemical such as dilute hydrofluoric (dHF) acid.

Reference is made to FIGS. 1 and 3A-3D. Dummy gate structures 130 are formed above the semiconductor fins 112, 114 and the isolation structures 120. Each of the dummy gate structures 130 includes a dummy gate dielectric layer 132, a dummy gate electrode layer 134, and a mask layer 136 formed over the dummy gate electrode layer 134. Formation of the dummy gate structures 130 includes depositing in sequence a dielectric layer, a dummy gate layer, and a mask layer over the substrate 110, patterning the mask layer into the patterned mask layer 136 using suitable photolithography and etching techniques, followed by patterning the dummy gate layer using the mask layer 136 as masks to form the dummy gate electrode layer 134. Subsequently, the dielectric layer is patterned to form the dummy gate dielectric layer 132. As such, the dummy gate dielectric layer 132, the dummy gate electrode layer 134, and the mask layer 136 are referred to as the dummy gate structure 130. In some embodiments, the dummy gate dielectric layer 132 may be made of silicon dioxide, silicon nitride, a high-x dielectric material or other suitable material. The dummy gate electrode layer 134 may be made of polycrystalline-silicon (poly-Si), poly-crystalline silicon-germanium (poly-SiGe), or other suitable materials. The mask layer 136 may be made of silicon dioxide, silicon nitride, other suitable materials, or combinations thereof.

Reference is made to FIGS. 1 and 4A-4D. Gate spacers 140 are respectively formed on sidewalls of the dummy gate structures 130. The gate spacers 140 may include a seal spacer and a main spacer (not shown). The gate spacers 140 include one or more dielectric materials, such as silicon oxide, silicon nitride, silicon oxynitride, SiOC, $SiC_xO_yN_z$, or combinations thereof. The seal spacers are formed on sidewalls of the dummy gate structure 130 and the main spacers are formed on the seal spacers. The gate spacers 140 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 140 may include blanket forming spacer layers, and then performing etching operations to remove the horizontal portions of the spacer layers. The remaining vertical portions of the gate spacer layers form the gate spacers 140. In some embodiments, each of the gate spacers 140 has a thickness from about 1 nm to about 12 nm.

In some embodiments, sidewall spacers 142 and 144, which are remaining parts of the gate spacers 140 that are not removed in the operation of etching the spacer layer, exist. Specifically, in the operation of the spacer layer deposition process, the spacer layer also covers the semiconductor fins 112 and 114. When the spacer layer is etched to form the gate spacers 140, portions of the spacer layer on sidewalls of the semiconductor fins 112 and 114 are pull-back-etched. The portions of the spacer layer thus remain at corners between the isolation structure 120 and the semiconductor fins 112/114 after the etching and form the sidewall spacers 142 and 144. In some other embodiments, however, the sidewall spacers 142 and 144 may be omitted. The sidewall spacers 142 and 144 may have different heights, which depend on the spacing between adjacent semiconductor fins 112 and 114.

Figures 5A, 5B:
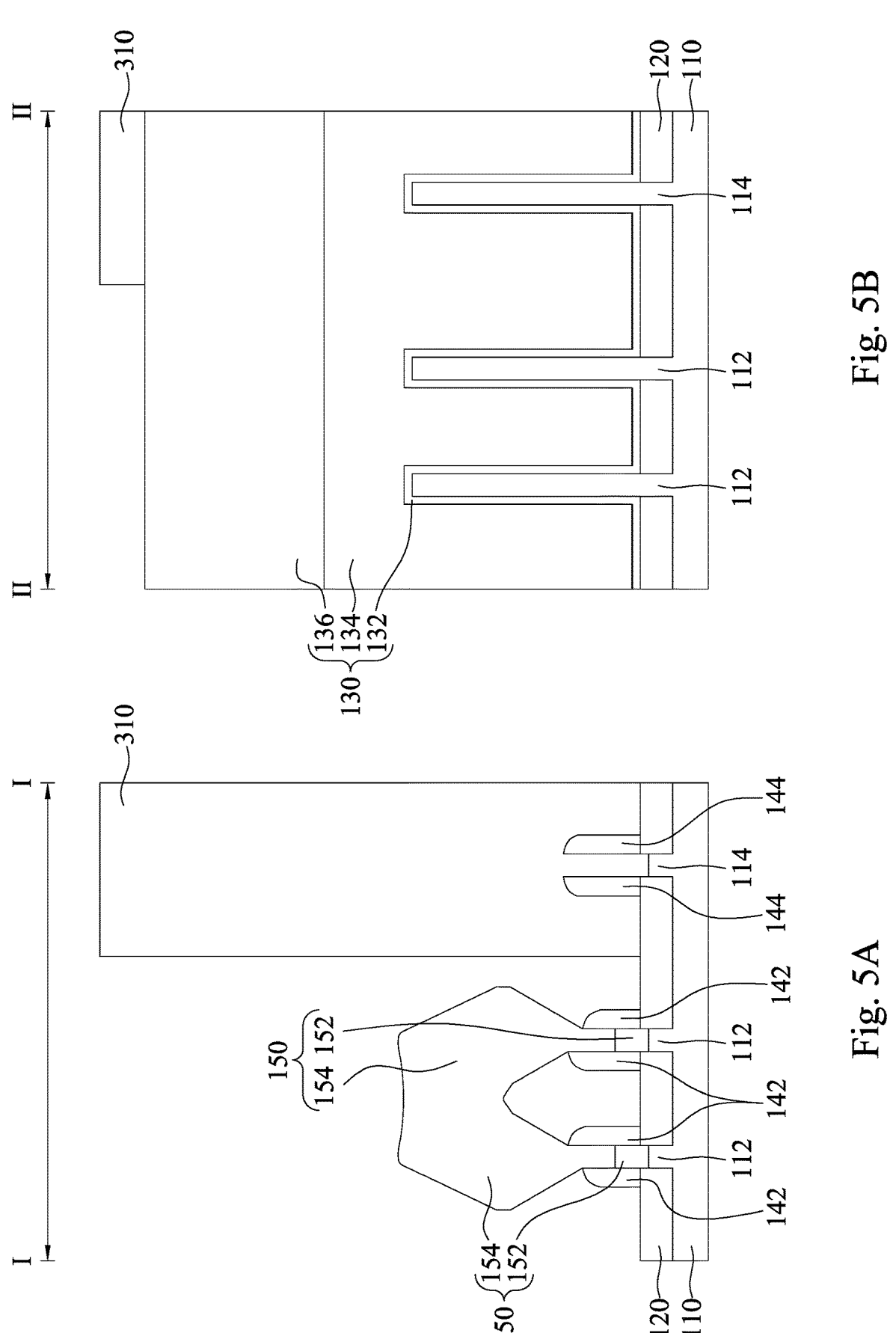
Figures 5C, 5D:
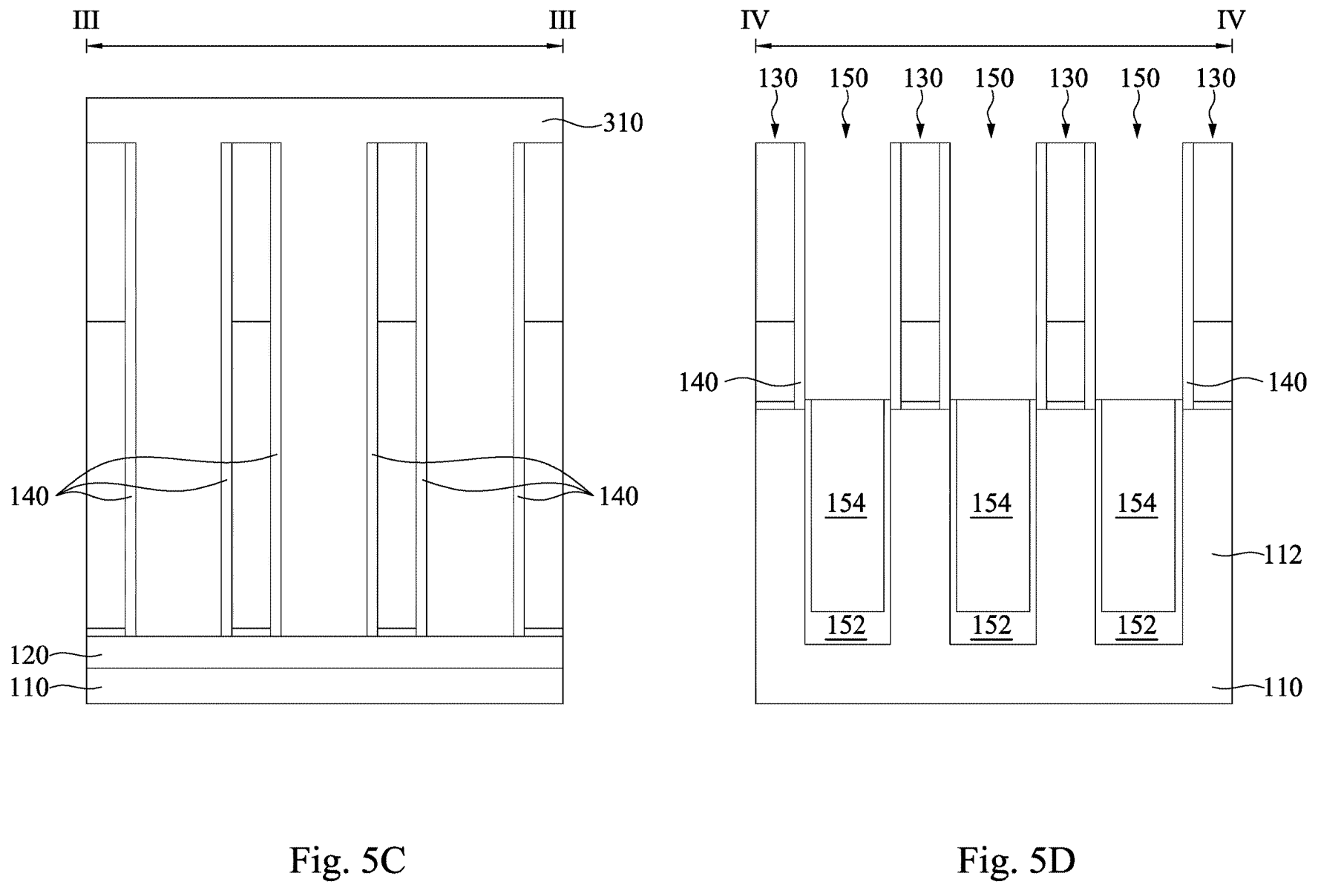
Figures 6A, 6B:
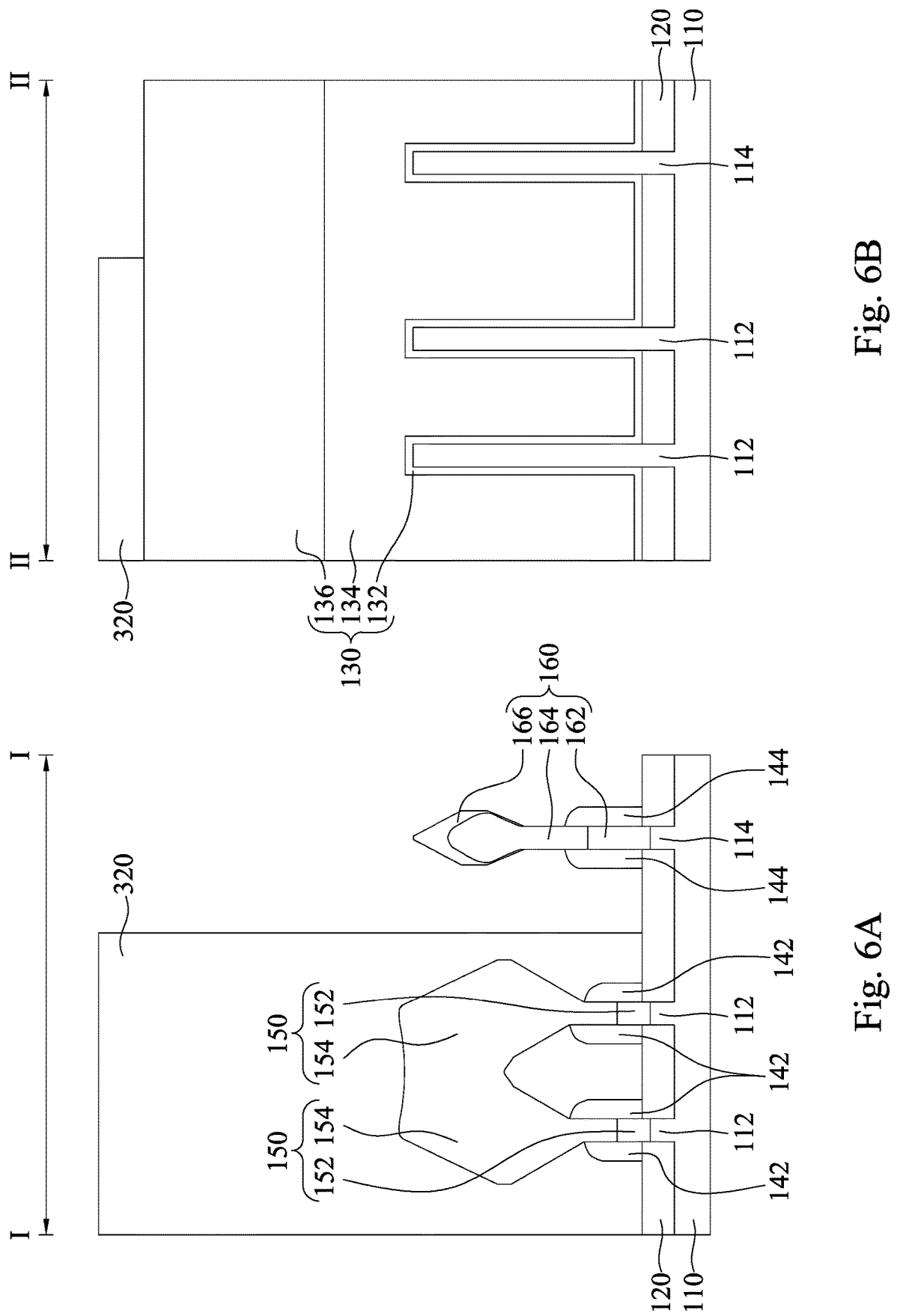
Figures 6C, 6D:
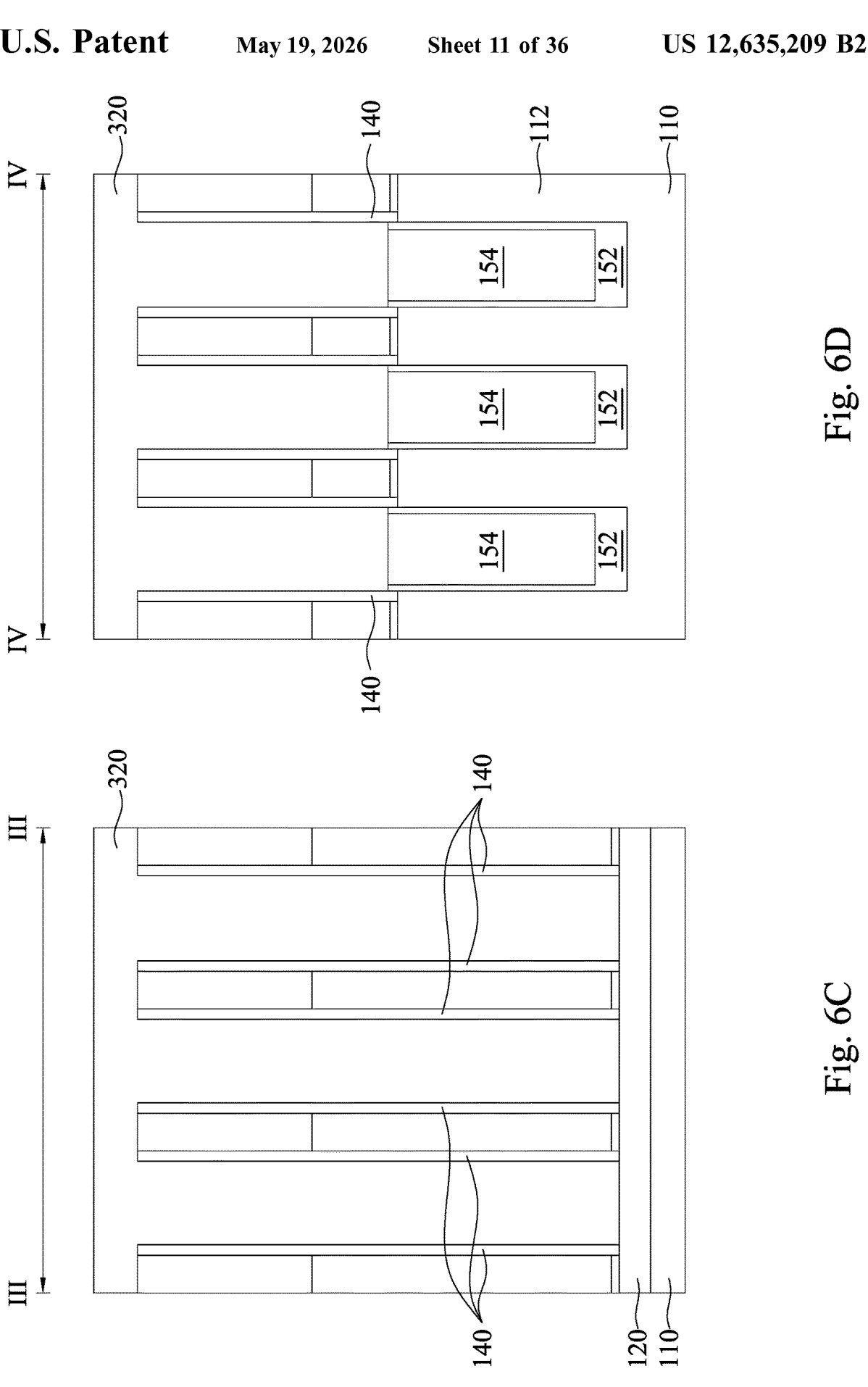
Figure 7B:
Figure 7B:
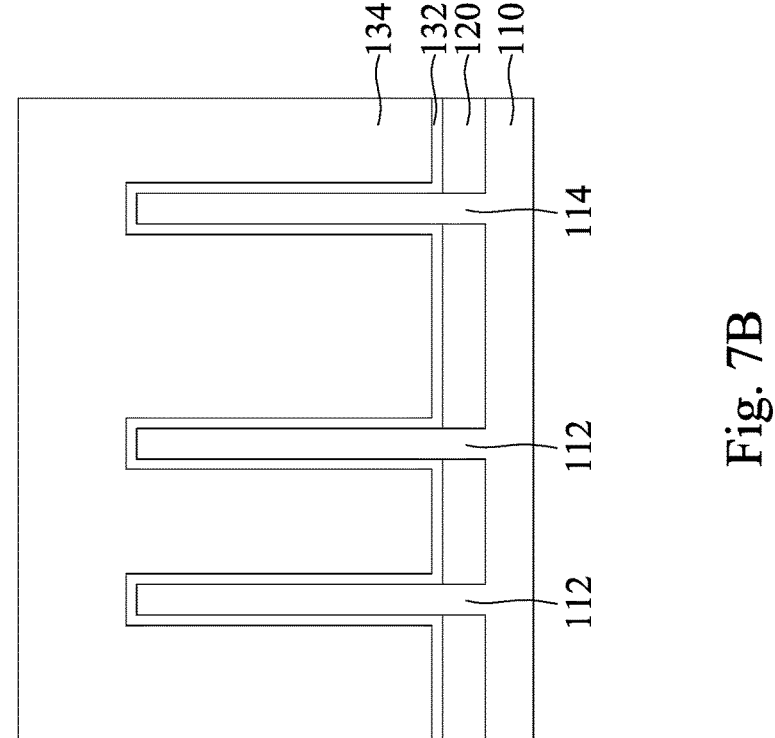
Figure 7A:
Figure 7A:
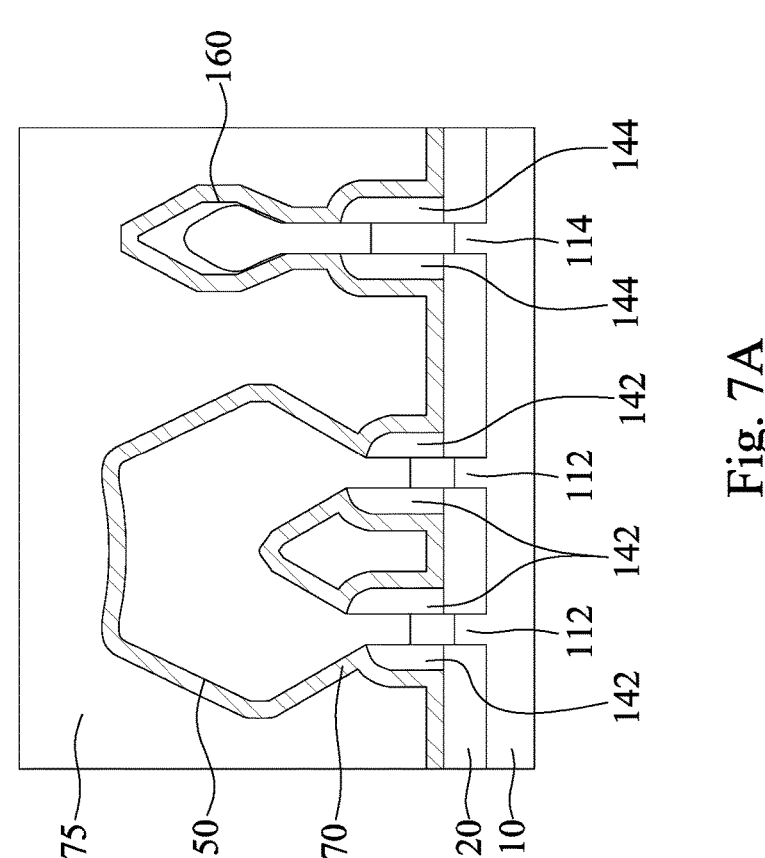
Figures 7C, 7D:
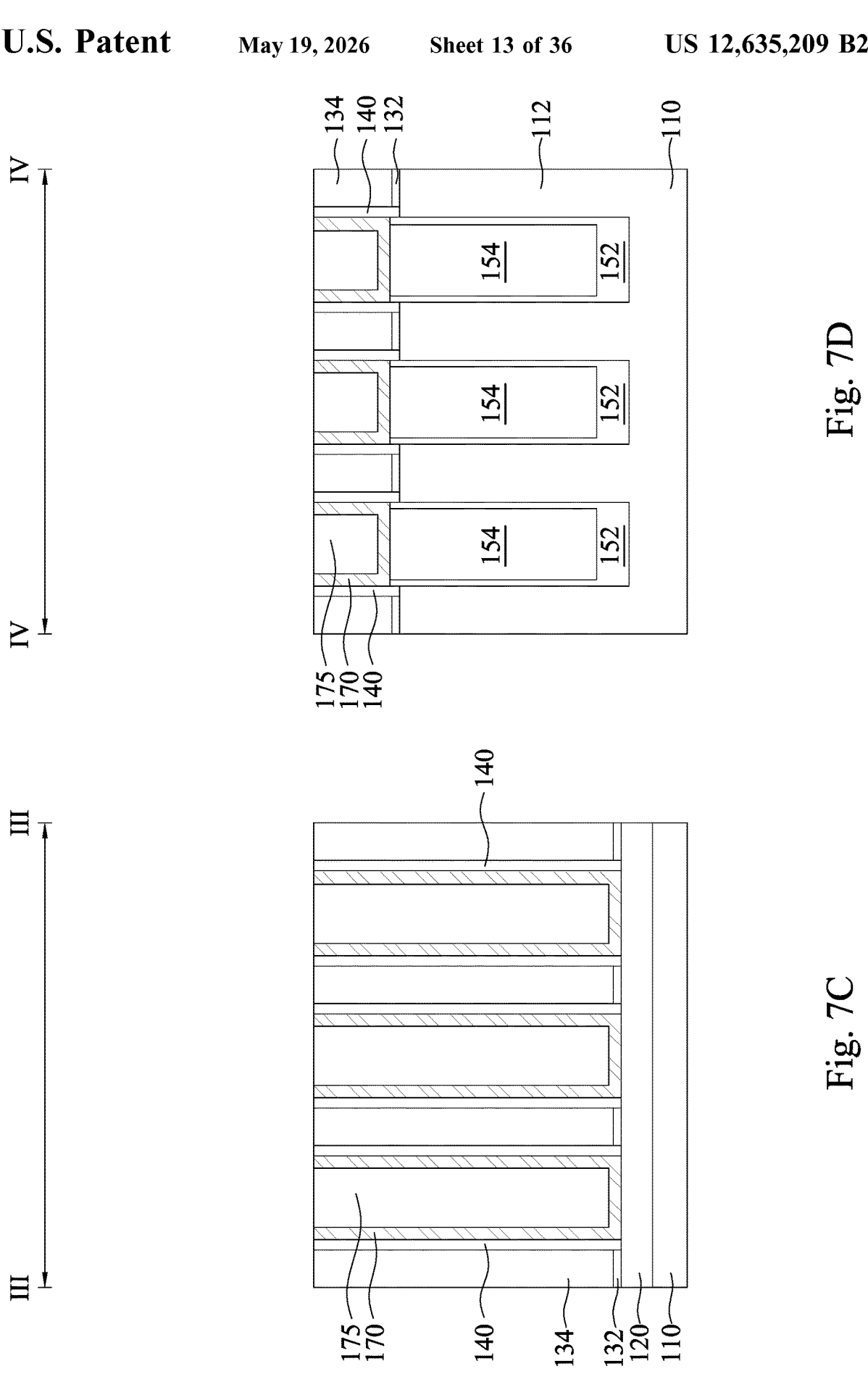
Figures 8A, 8B:
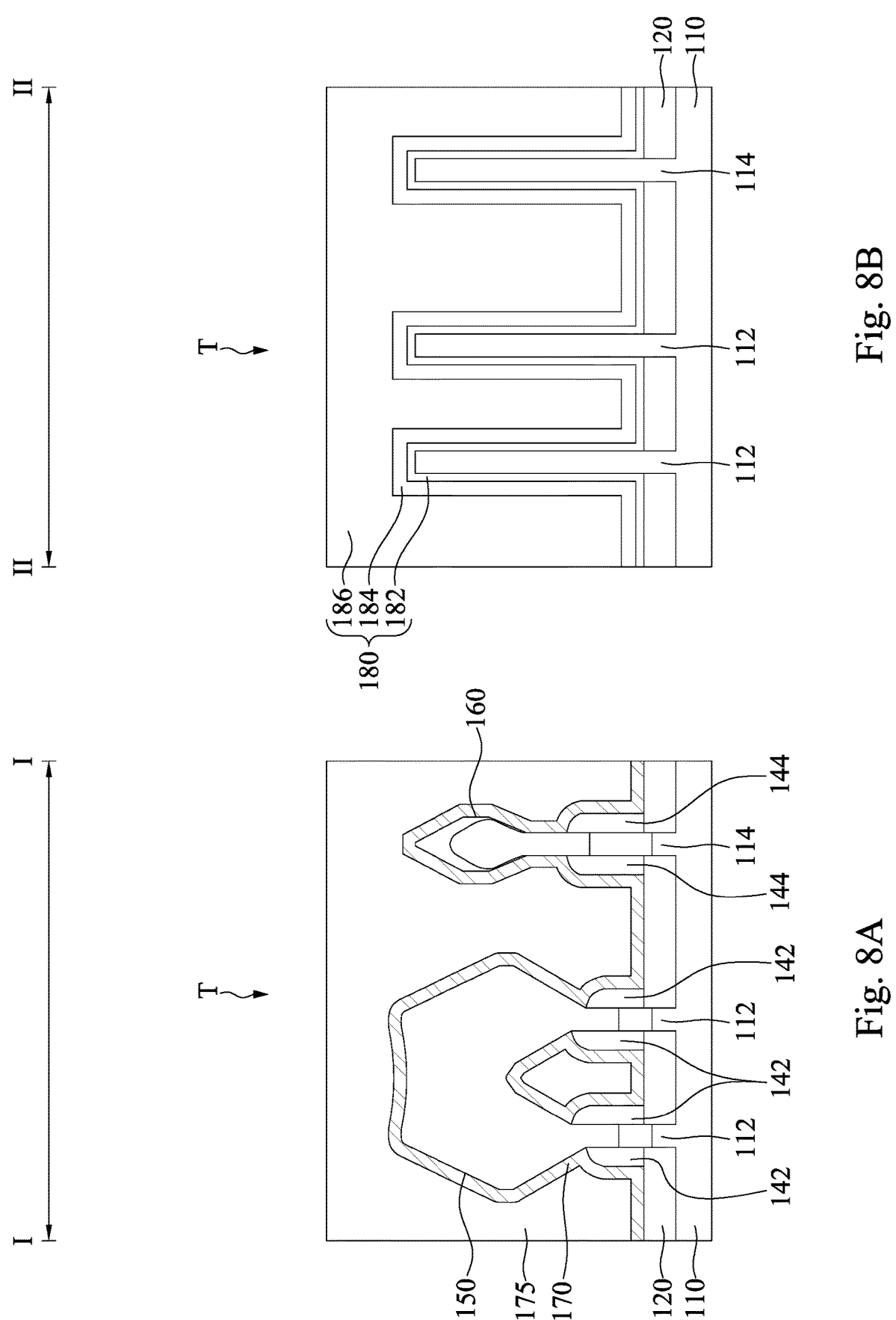

Reference is made to FIGS. 1 and 5A-5D. The semiconductor fins 112 and 114 are recessed by using the dummy gate structures 130 and the gate spacers 140 as etch masks. A first mask layer 310 is then formed over the substrate 110. The semiconductor fins 112 are uncovered by the first mask layer 310 while the semiconductor fins 114 are covered by the first mask layer 310. First source/drain epitaxial structures 150 are then formed on the recessed portions of the semiconductor fins 112 uncovered by the dummy gate structures 130, the gate spacers 140, and the first mask layer 310 by performing, for example, a selectively growing process. The first source/drain epitaxial structures 150 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The first source/drain epitaxial structures 150 have suitable crystallographic orientations. The first source/drain epitaxial structures 150 may be merged together as shown in FIG. 5A or be separated from each other. In some embodiments, where a P-type device is desired, the first source/drain epitaxial structure 150 may include an epitaxially growing silicon germanium (SiGe). In some embodiments, where an N-type device is desired, the first source/drain epitaxial structures 150 may include an epitaxially growing silicon phosphorus (SiP) or silicon carbon (SiC). The epitaxial processes include CVD deposition techniques (e.g., vapor-phase epitaxy (VPE) and/or ultra-high vacuum CVD (UHV-CVD)), molecular beam epitaxy, and/or other suitable processes.

In some embodiments, each of the first source/drain epitaxial structures 150 includes a first epitaxial layer 152 formed on the semiconductor fin 112 and a second epitaxial layer 154 formed on the first epitaxial layer 152. The first and second epitaxial layers 152 and 154 are crystalline semiconductor layers, such as Si, SiC, SiCP, SiP, Ge and SiGe, having different lattice constants from each other and from the semiconductor fins 112. When SiGe are used, the Ge concentration of the first epitaxial layer 152 is different from that of the second epitaxial layers 154. When SiC, SiP and/or SiCP are used, the C or P concentration of the first epitaxial layer 152 is different from that of the second epitaxial layers 154. In some embodiments, a Group III-V semiconductor layer is used for at least one of the first and second epitaxial layers 152 and 154. In some other embodiments, more than two epitaxial layers are formed.

Reference is made to FIGS. 1 and 6A-6D. The first mask layer 310 of FIGS. 5A-5D is removed, and a second mask layer 320 is formed over the substrate 110. The semiconductor fins 112 and the first source/drain epitaxial structures 150 are covered by the second mask layer 320 while the semiconductor fins 114 are uncovered by the second mask layer 320. Second source/drain epitaxial structures 160 are formed on the recessed portion of the semiconductor fins 114 by performing, for example, a selectively growing process. The second source/drain epitaxial structures 160 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The second source/drain epitaxial structures 160 have suitable crystallographic orientations, such that the second source/drain epitaxial structures 160 have diamond cross sections. In some embodiments, where a P-type device is desired, the second source/drain epitaxial structure 160 may include an epitaxially growing silicon germanium (SiGe). In some embodiments, where an N-type device is desired, the second source/drain epitaxial structures 160 may include an epitaxially growing silicon phosphorus (SiP) or silicon carbon (SiC). The first source/drain epitaxial structures 150 and the second source/drain epitaxial structures 160 have different conductivity types. For example, the first source/drain epitaxial structures 150 are P-type, and the second source/drain epitaxial structures 160 are P-type, or vice versa. The epitaxial processes include CVD deposition techniques (e.g., vapor-phase epitaxy (VPE) and/or ultra-high vacuum CVD (UHV-CVD)), molecular beam epitaxy, and/or other suitable processes.

In some embodiments, the second source/drain epitaxial structures 160 includes a first epitaxial layer 162 formed on the semiconductor fin 114, a second epitaxial layer 164 formed on the first epitaxial layer 162, and a third epitaxial layer 166 formed on the second epitaxial layer 164. The first, second, and third epitaxial layers 162, 164, and 166 are crystalline semiconductor layers, such as Si, SiC, SiCP, SiP, Ge and SiGe, having different lattice constants from each other and from the semiconductor fins 114. When SiGe are used, the Ge concentration of the first epitaxial layer 162 is different from that of the second and third epitaxial layers 164 and 166. When SiC, SiP and/or SiCP are used, the C or P concentration of the first epitaxial layer 162 is different from that of the second and third epitaxial layers 164 and 166. In some embodiments, a Group III-V semiconductor layer is used for at least one of the first, second, and third epitaxial layers 162, 164, 166. In some other embodiments, only one or two of the first, second, and third epitaxial layers 162, 164, and 166 is formed, and in some other embodiments, more epitaxial layers are formed.

Reference is made to FIGS. 1 and 7A-7D. The second mask layer 320 of FIGS. 6A-6D is removed. A contact etch stop layer (CESL) 170 is then conformally formed over the first source/drain epitaxial structures 150, the second source/drain epitaxial structures 160, the dummy gate structures 130, the gate spacers 140, and the isolation structures 120. In some embodiments, the CESL 170 can be a stressed layer or layers. In some embodiments, the CESL 170 has a tensile stress and is formed of $Si_3N_4$. In some other embodiments, the CESL 170 includes materials such as oxynitrides. In yet some other embodiments, the CESL 170 may have a composite structure including a plurality of layers, such as a silicon nitride layer overlying a silicon oxide layer. The CESL 170 can be formed using plasma enhanced CVD (PECVD), however, other suitable methods, such as low pressure CVD (LPCVD), atomic layer deposition (ALD), and the like, can also be used.

A first interlayer dielectric (ILD) layer 175 is then formed on the CESL 170. The first ILD layer 175 may be formed by chemical vapor deposition (CVD), high-density plasma CVD, spin-on, sputtering, or other suitable methods. In some embodiments, the first ILD layer 175 includes silicon oxide. In some other embodiments, the first ILD layer 175 may include silicon oxy-nitride, silicon nitride, or a low-k material. Subsequently, a planarization process, such as a chemical mechanical planarization (CMP) process, is performed to planarize the CESL 170 and the first ILD layer 175 to expose the dummy gate electrode layers 134 of the dummy gate structures 130.

Reference is made to FIGS. 1 and 8A-8D. The dummy gate electrode layers 134 and the dummy gate dielectric layers 132 (see FIGS. 7B-7D) are removed, resulting in gate trenches between corresponding gate spacers 140. The dummy gate electrode layers 134 and the dummy gate dielectric layers 132 are removed by using a selective etching process (e.g., selective dry etching, selective wet etching, or combinations thereof) that etches materials in the dummy gate electrode layers 134 and the dummy gate dielectric layers 132 at a faster etch rate than it etches other materials (e.g., the gate spacers 140, the CESL 170, and/or the first ILD layer 175).

Thereafter, replacement gate structures 180 are respectively formed in the gate trenches. The gate structures 180 may be the final gates of FinFETs. The final gate structures each may be a high-k/metal gate stack, however other compositions are possible. In some embodiments, each of the gate structures 180 forms the gate associated with the three-sides of the channel region provided by the semiconductor fins 112 and 114. Stated another way, each of the gate structures 180 wraps around the semiconductor fins 112 or 114 on three sides. In some embodiments, each of the gate structures 180 has a width W1 in a range from about 9 nm to about 100 nm and a vertical thickness VT1 (directly above the semiconductor fins 112/114) in a range from about 5 nm to about 30 nm.

In various embodiments, the (high-k/metal) gate structure 180 includes a gate dielectric layer 182 lining the gate trench and a gate electrode over the gate dielectric layer 182. The gate electrode may include a work function metal layer 184 formed over the gate dielectric layer 182 and a fill metal 186 formed over the work function metal layer 184 and filling a remainder of gate trenches. The gate dielectric layer 182 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 184 and/or fill metal 186 used within high-k/metal gate structures 180 may include a metal, metal alloy, or metal silicide. Formation of the high-k/metal gate structures 180 may include multiple deposition processes to form various gate materials, one or more liner layers, and one or more CMP processes to remove excessive gate materials.

In some embodiments, the interfacial layer of the gate dielectric layer 182 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 182 may include hafnium oxide ($HfO_2$). Alternatively, the gate dielectric layer 182 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 184 may include work function metals to provide a suitable work function for the high-k/metal gate structures 180. For an n-type FinFET, the work function metal layer 184 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 184 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 186 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

As shown in FIGS. 8A-8D, transistors T are formed over the substrate 110. The transistors T includes the semiconductor fins 112, 114, the gate structures 180, the source/drain epitaxial structures 150, 160, the CESL 170 covering the source/drain epitaxial structures 150, 160, and the first ILD layer 175 covering the CESL 170 and surrounds the gate structures 180.

Figures 9A, 9B:
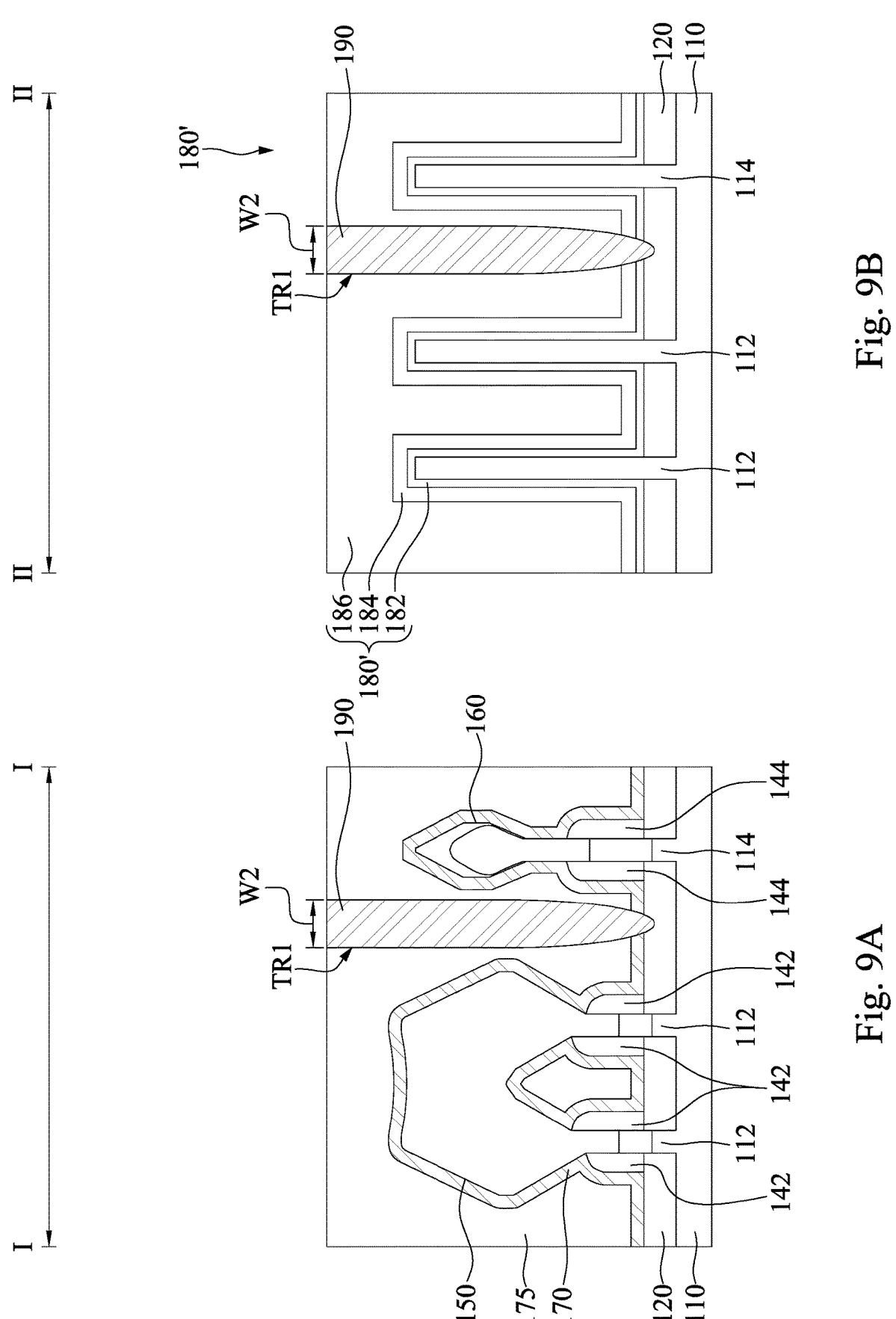
Figures 9C, 9D:
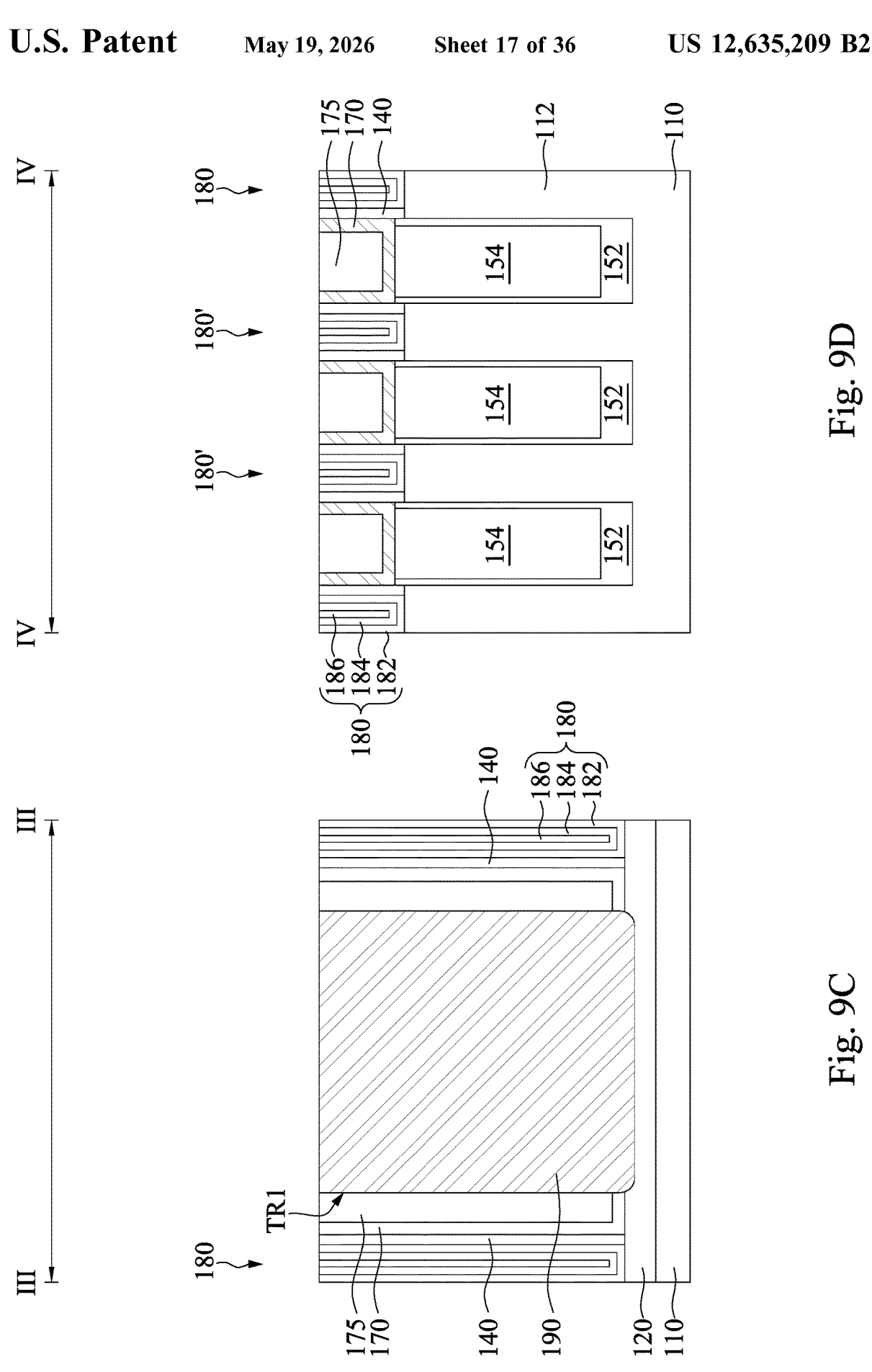

Reference is made to FIGS. 1 and 9A-9D. Dielectric structures 190 are formed over the substrate 110 to cut some of the gate structures 180 into gate structures 180'. Specifically, a CMG process is performed to some of the gate structures 180 and the first ILD layer 175, such that trenches TR1 are formed to cut the gates structures 180 into gates structures 180'. The CMG process performed to the gate structures 180 and the first ILD layer 175 may include a wet etch, a dry etch, and/or combinations thereof. A dielectric material then fills the trenches TR1 to form dielectric structures 190 between and in contact with the gates structures 180' and between the source/drain epitaxial structures 150 and 160. That is, portions of the dielectric structures 190 are embedded in the first ILD layer 175 as shown in FIG. 9A. The dielectric material may be deposited by CVD, ALD, spin-on coating, or other suitable techniques. The dielectric material may include silicon oxide, silicon nitride, silicon oxynitride, AlOx, SiCN, SiCON, SiOC, combinations thereof, and/or other suitable dielectric material layer. A CMP may be performed to polish back the dielectric material hereby provide a substantially planar top surface of the dielectric structures 190 with respect to the gates structures 180 and 180'. As a result, some of the gate structure lines (e.g., the gate structures 180) are cut into the gate structures 180', and separated by the CMG dielectric (e.g., the dielectric structures 190). In some embodiments, the dielectric structure 190 has a width W2 in a range from about 10 nm to about 30 nm.

Reference is made to FIGS. 1 and 10A-10D. A middle contact etch stop layer (MCESL) 210 is then formed over the substrate 110. The MCESL 210 may be formed by a PECVD process and/or other suitable deposition processes. In some embodiments, the MCESL 210 is a silicon nitride layer and/or other suitable materials having a different etch selectivity than a subsequently formed second ILD layer 220. In some embodiments, the MCESL 210 has a thickness in a range from about 1 nm to about 5 nm. A second ILD layer 220 is then formed over the MCESL 210. In some embodiments, the second ILD layer 220 has a thickness in a range from about 1 nm to about 25 nm. Materials, configurations, dimensions, processes and/or operations regarding the second ILD layer 220 are similar to or the same as the first ILD layer 175 of FIG. 7A.

Reference is made to FIGS. 1 and 11A-11C. A patterned mask layer 330 is formed over the second ILD layer 220. The patterned mask layer 330 has openings O1 exposing portions of the second ILD layer 220. The second ILD layer 220 is then patterned by using the patterned mask layer 330 as an etch mask to form contact openings O2 extending through the second ILD layer 220 and into the MCESL 210 by using one or more etching process(es) (also called contact etching process) ET1. The etching duration time of the contact etching process ET1 is controlled to allow removing portions of the second ILD layer 220 and the MCESL 210 but not exposing the underlying first ILD layer 175.

Figures 10A, 10B:
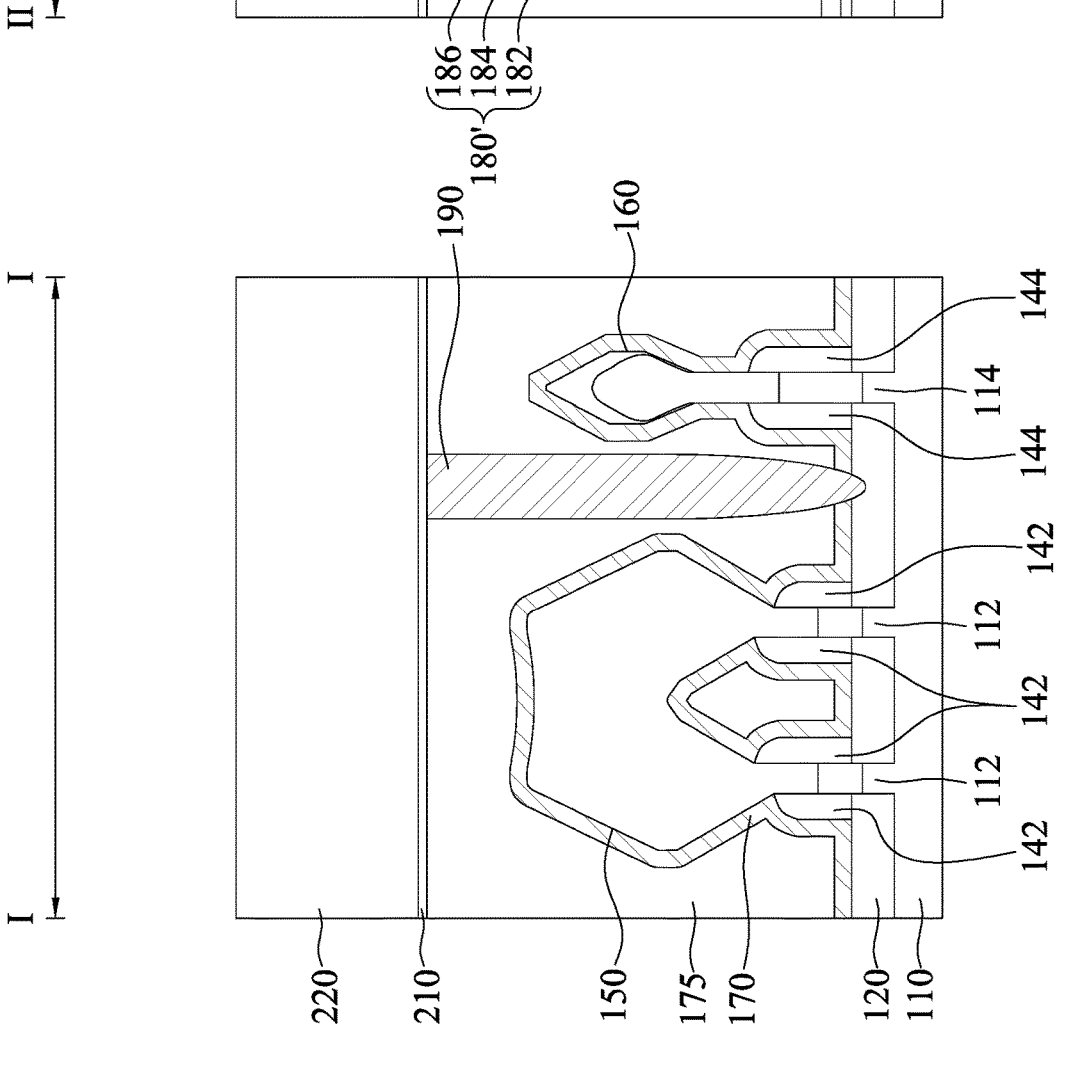
Figures 10C, 10D:
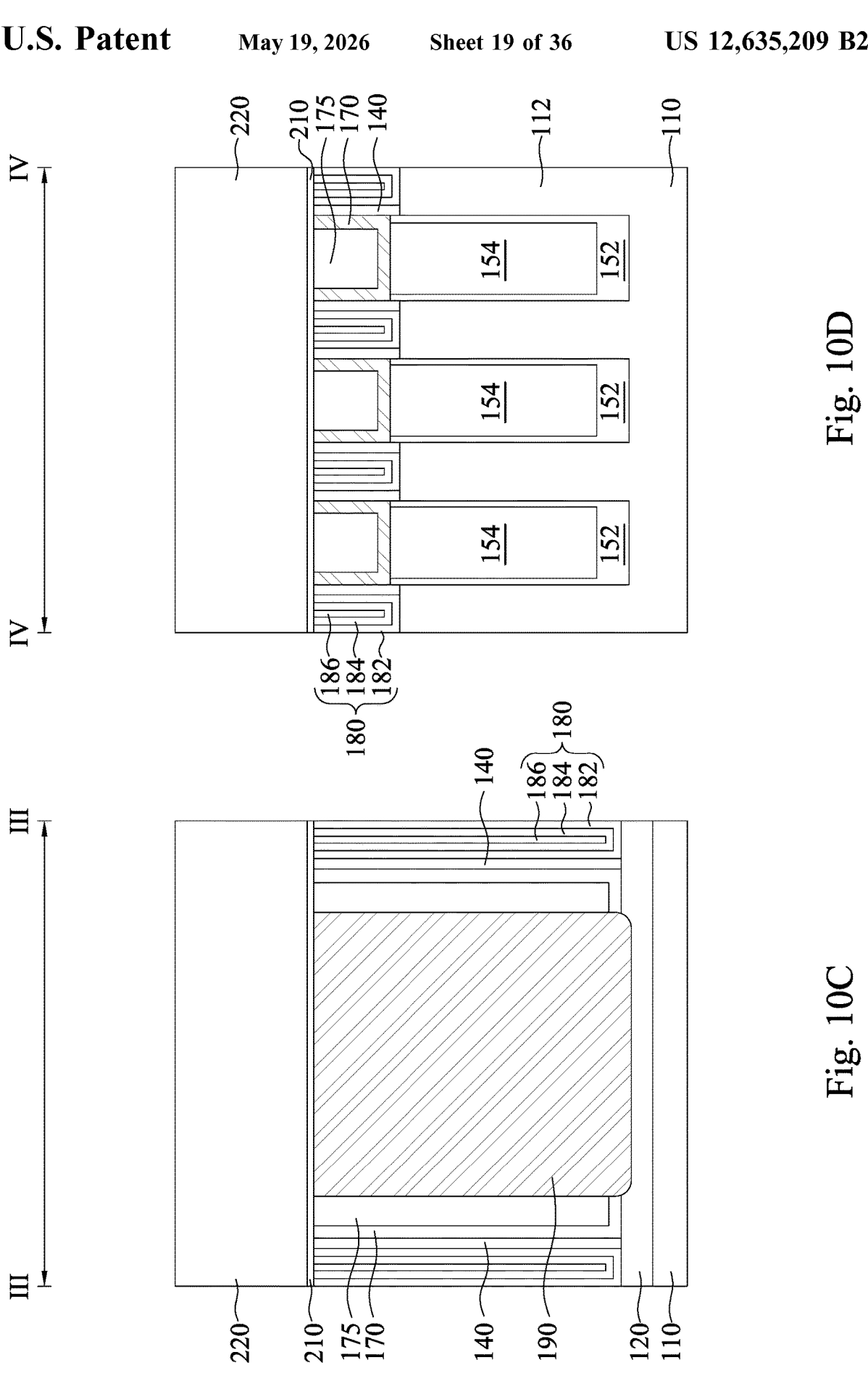

In some embodiments, the contact etching process ET1 is an anisotropic etching process, such as a plasma etching (e.g., inductively coupled plasma (ICP), capacitively coupled plasma (CCP), or the like). The etchant and/or etching conditions of the contact etching process ET1 are selected in such a way that the nitride material (e.g., the MCESL 210) exhibits a slower etch rate than the oxide material (e.g., the second ILD layer 220). Stated differently, the MCESL 210 has a higher etch resistance than the second ILD layer 220 in the contact etching process ET1. In this way, the MCESL 210 can inhibit or slow down the etching in the MCESL 210 during the contact etching process ET1. Take plasma etching for example, the semiconductor substrate 110 having the structure illustrated in FIG. 10A is loaded into a plasma tool and exposed to a plasma environment generated by RF or microwave power in a gaseous mixture of a fluorine-containing gas (e.g., $C_4F_6$, $C_4F_8$), or similar species), an oxygen-containing gas (e.g., $O_2$), a nitrogen-containing gas (e.g., $N_2$), and an inert gas (e.g., argon or helium), for a duration time sufficient to etch a sufficient portion of the second ILD layer 220. The plasma etching environment has a pressure between about 3 mTorr and 100 mTorr and the plasma is generated by RF power between about 0 Watts and 500 Watts with plasma frequency in a range from about 0.8 MHz to about 60 Hz.

Reference is made to FIGS. 1 and 12A-12C. A second etching process (also called nitride-pull-back (NPB) process) ET2 is performed. The etching time duration of the NPB etching process ET2 is controlled to etch back or recess a portion of the dielectric structure 190, which is embedded in the first ILD layer 175, thus deepening or extending the contact opening O2 down to the dielectric structure 190. As a result of the NPB etching process ET2, the dielectric structure 190 and/or the first ILD layer 175 get exposed at bottoms of the deepened contact openings O2.

Figure 11A:
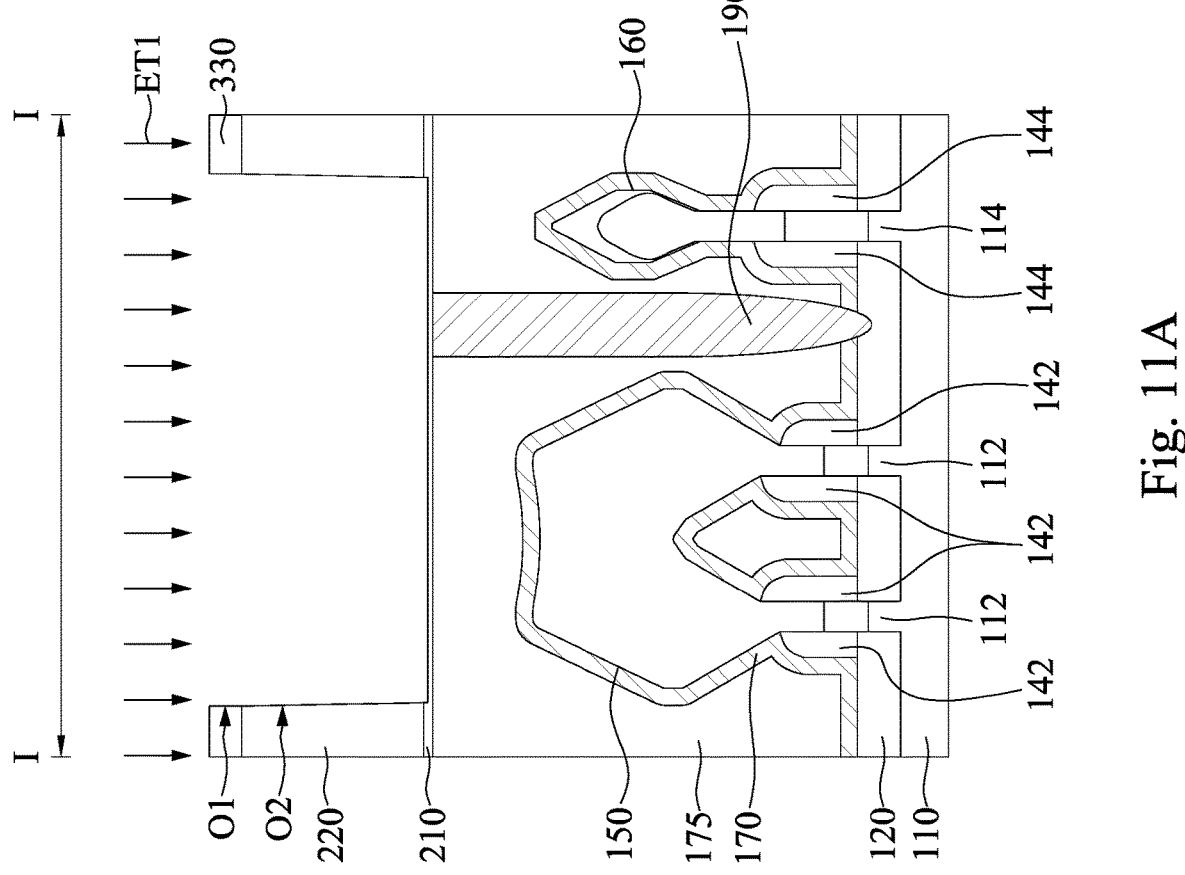
Figures 11B, 11C:
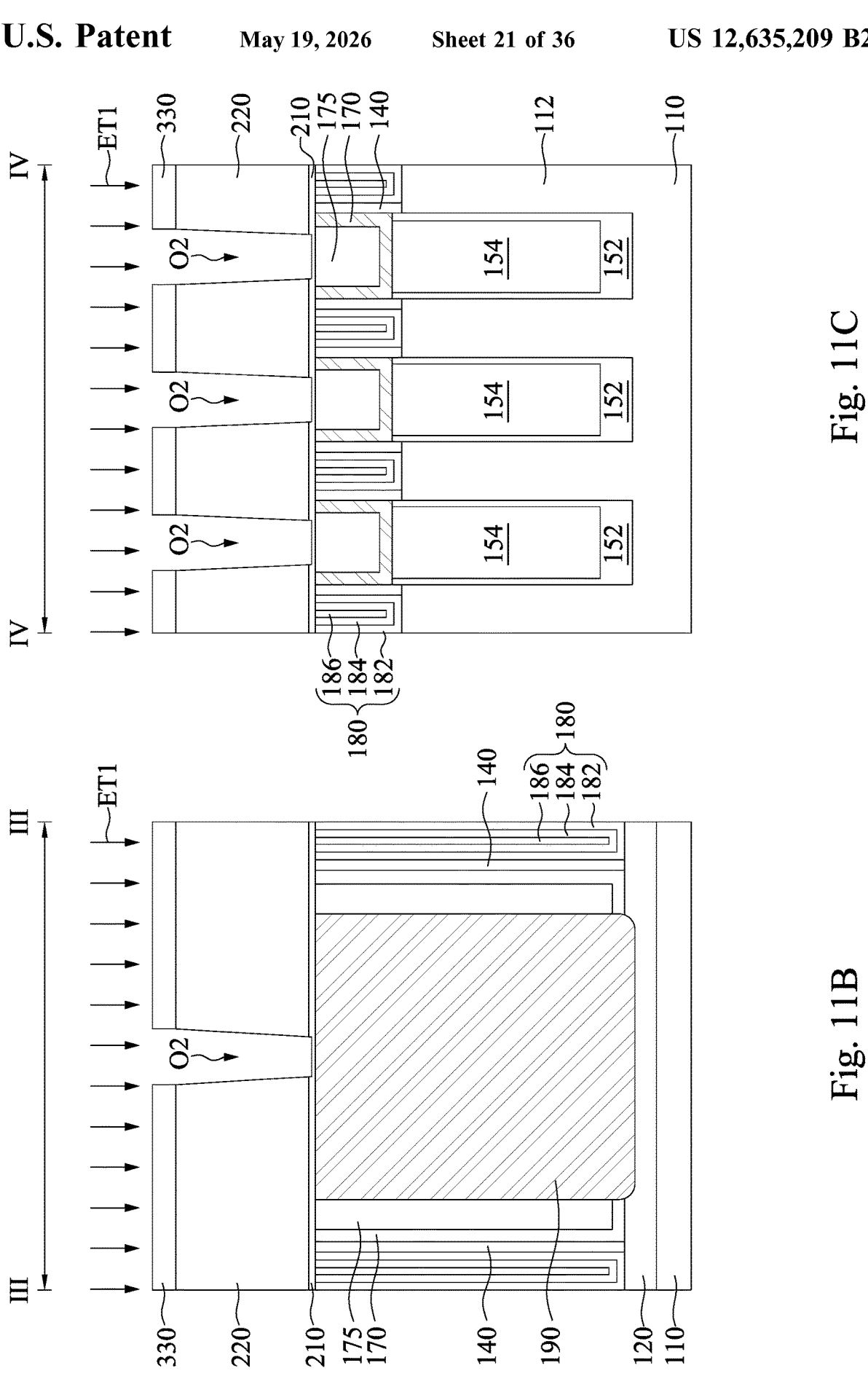

In some embodiments, the NPB etching process ET2 is an anisotropic etching process, such as a plasma etching (e.g., inductively coupled plasma (ICP), capacitively coupled plasma (CCP), or the like), using a different etchant and/or etching conditions than the contact etching process ET1. The etchant and/or etching conditions of the NPB etching process ET2 are selected in such a way that the oxide material (e.g., the first ILD layer 175) exhibits a slower etch rate than the nitride material (e.g., the dielectric structure 190). Stated differently, the first ILD layer 175 has a higher etch resistance than the dielectric structure 190 in the NPB etching process ET2. In this way, the first ILD layer 175 can inhibit or slow down the etching in the first ILD layer 175 during the NPB etching process ET2. Take plasma etching for example, the semiconductor substrate 110 having the structure illustrated in FIG. 11A is loaded into a plasma tool and exposed to a plasma environment generated by RF or microwave power in a gaseous mixture of a fluorine-containing gas (e.g., $CH_2F_2$, $CH_3F$, $CF_4$, $C_4F_8$, $C_4F_6$, or similar species), a hydrogen-containing gas (e.g., $H_2$), an oxygen-containing gas (e.g., $O_2$), a nitrogen-containing gas (e.g., $N_2$), and an inert gas (e.g., argon or helium), for a duration time sufficient to etch a sufficient portion of the dielectric structure 190. Stated another way, a hydrogen concentration of the gas mixture used in the NPB etching process ET2 is higher than a hydrogen concentration of the gas mixture used in the contact etching process ET1. The plasma etching environment has a pressure between about 3 mTorr and 100 mTorr and the plasma is generated by RF power between about 0 Watts and 500 Watts with plasma frequency in a range from about 0.8 MHz to about 60 Hz.

Plasma generated from a hydrogen-containing gas mixture can etch silicon nitride at a faster etch rate than etching silicon oxide, and thus the NPB etching process ET2 using a hydrogen-containing gas mixture etches the first ILD layer 175 at a slower etch rate than etching the dielectric structure 190. In this way, the first ILD layer 175 can inhibit or slow down the etching during the NPB etching process ET2. An excessively high $H_2$ gas flow rate may lead to an excessively fast etch rate in etching through the dielectric structure 190. An excessively low $H_2$ gas flow rate may lead to insufficient etch selectivity between the dielectric structure 190 and the first ILD layer 175.

Figure 12A:
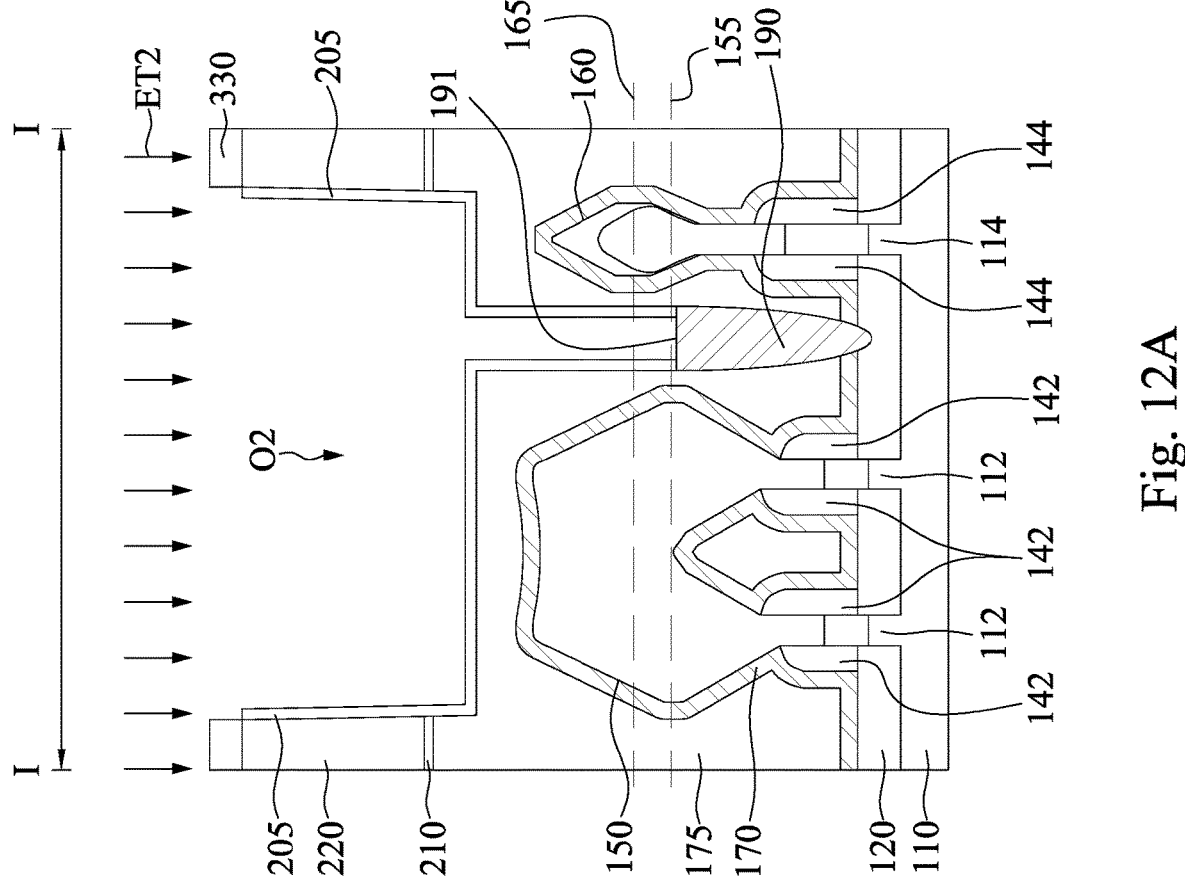
Figures 12B, 12C:
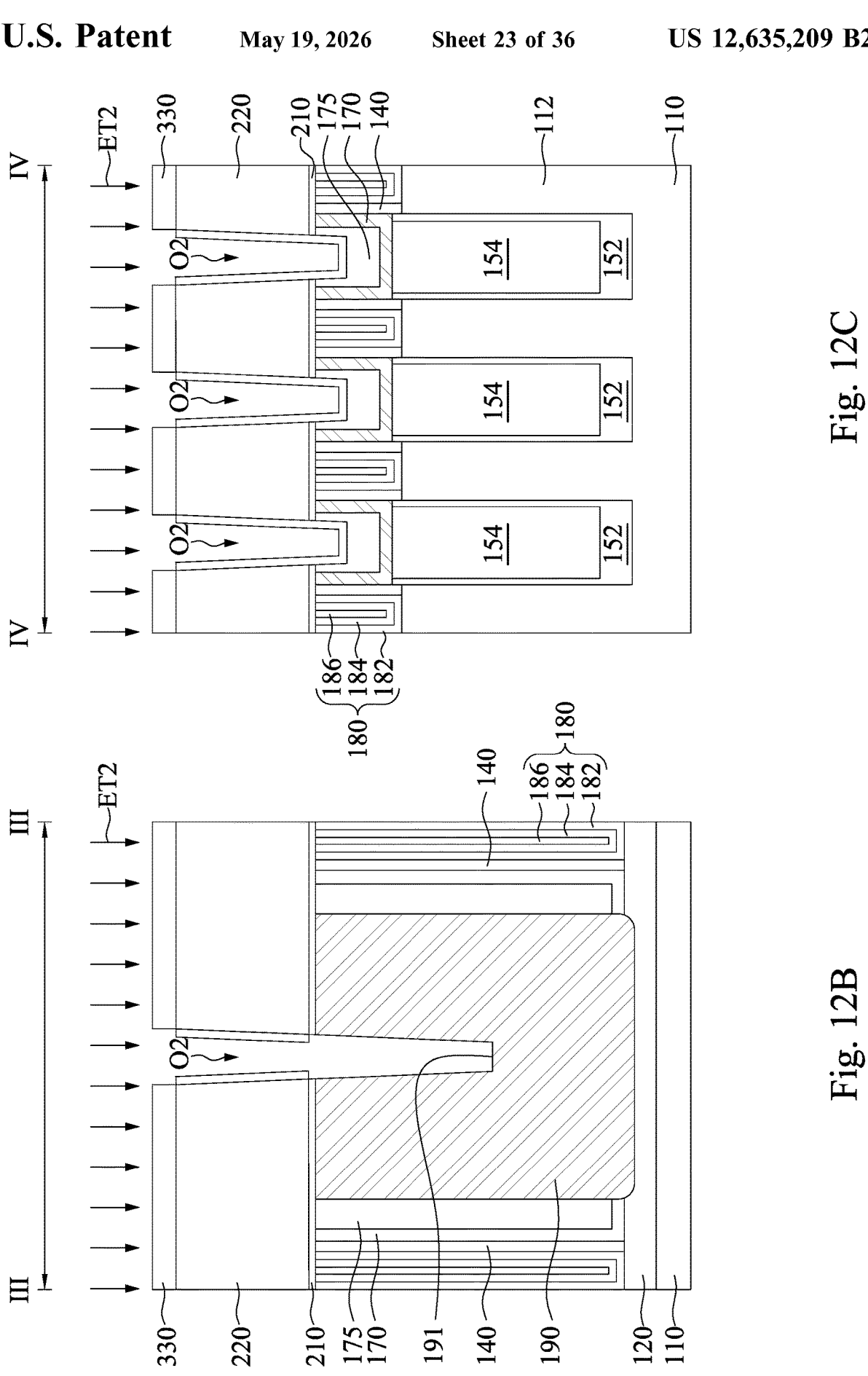

In FIG. 12A, a portion of the dielectric structure 190 exposed by the contact opening O2 has a top surface 191 lower than or substantially coplanar with a level (or position) 155 at which the first source/drain epitaxial structure 150 has a largest horizontal width. Alternatively, the top surface 191 is lower than or substantially coplanar with a level (or position) 165 at which the second source/drain epitaxial structure 160 has a largest horizontal width. Further, after the NPB etching process ET2, the first ILD layer 175 still covers the first source/drain epitaxial structure 150 and the second source/drain epitaxial structure 160. Stated differently, portions of the first ILD layer 175 are directly over the first source/drain epitaxial structure 150 and the second source/drain epitaxial structure 160, respectively.

In some embodiments, the etching gas used in the NPB etching process ET2 is polymerized and form polymer layers 205 on surfaces of the contact openings O2. In some embodiments, the polymer layers 205 include elements from a gas used in the NPB etching process ET2, such as carbon or other applicable materials. In some embodiments, the polymer layers 205 are formed on oxide materials (e.g., the first ILD layer 175 and the second ILD layer 220) but not or barely on nitride materials (e.g., the dielectric structure 190).

Reference is made to FIGS. 1 and 13A-13C. The polymer layers 205 (see FIGS. 12A-12C) are removed by a third etching process (also called polymer removal process) ET3, in accordance with some embodiments. In some embodiments, the polymer removal etching process ET3 is at least one of a plasma etching process, a reactive ion etching (RIE) process, a wet etching process, or other applicable techniques. According to some embodiments, the polymer removal etching process ET3 is a plasma etching process utilizing a mixture of $N_2$, $H_2$, and $O_3$ gases, or other applicable materials. In some embodiments, one or more of the materials utilized in the polymer removal etching process ET3 are gaseous. According to some embodiments, the polymer removal etching process ET3 is different than the NPB etching process ET2 at least in terms of at least one of pressure, temperature, etchants, or other applicable parameters such that the polymer layers 205 formed by the NPB etching process ET2 is removed by the polymer removal etching process ET3. For example, the plasma etching environment of the polymer removal etching process ET3 has a pressure between about 30 mTorr and 500 mTorr and the plasma is generated by RF power between about 50 Watts and 800 Watts.

As mentioned above, the first ILD layer 175 still covers the first source/drain epitaxial structure 150 and the second source/drain epitaxial structure 160 after the NPB etching process ET2, such that the first ILD layer 175 acts as a protection layer to protect the underlying structures (e.g., the CESL 170, the first source/drain epitaxial structure 150, and the second source/drain epitaxial structure 160) from being damaged during the polymer removal etching process ET3.

Reference is made to FIGS. 1 and 14A-14C. A fourth etching process (also called oxide-initial-etching-back (OIEB) process) ET4 is performed. The etching time duration of the OIEB etching process ET4 is controlled to etch back the exposed portion of the first ILD layer 175, which are over the source/drain epitaxial structures 150 and 160, thus deepening or extending the contact opening O2 down to the CESL 170. As a result of the OIEB etching process ET4, the CESL 170 and the source/drain epitaxial structures 150 and 160 get exposed at bottoms of the deepened contact openings O2.

Figure 13A:
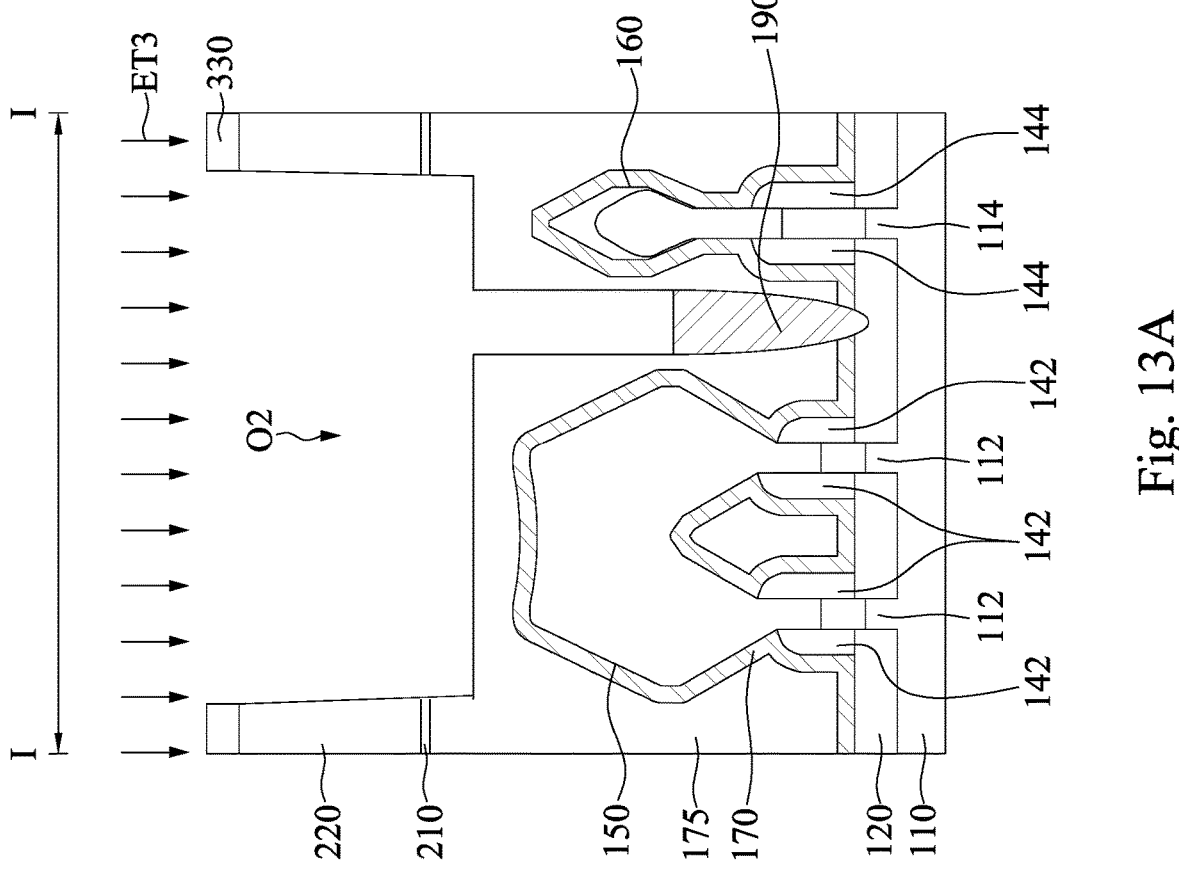
Figures 13B, 13C:
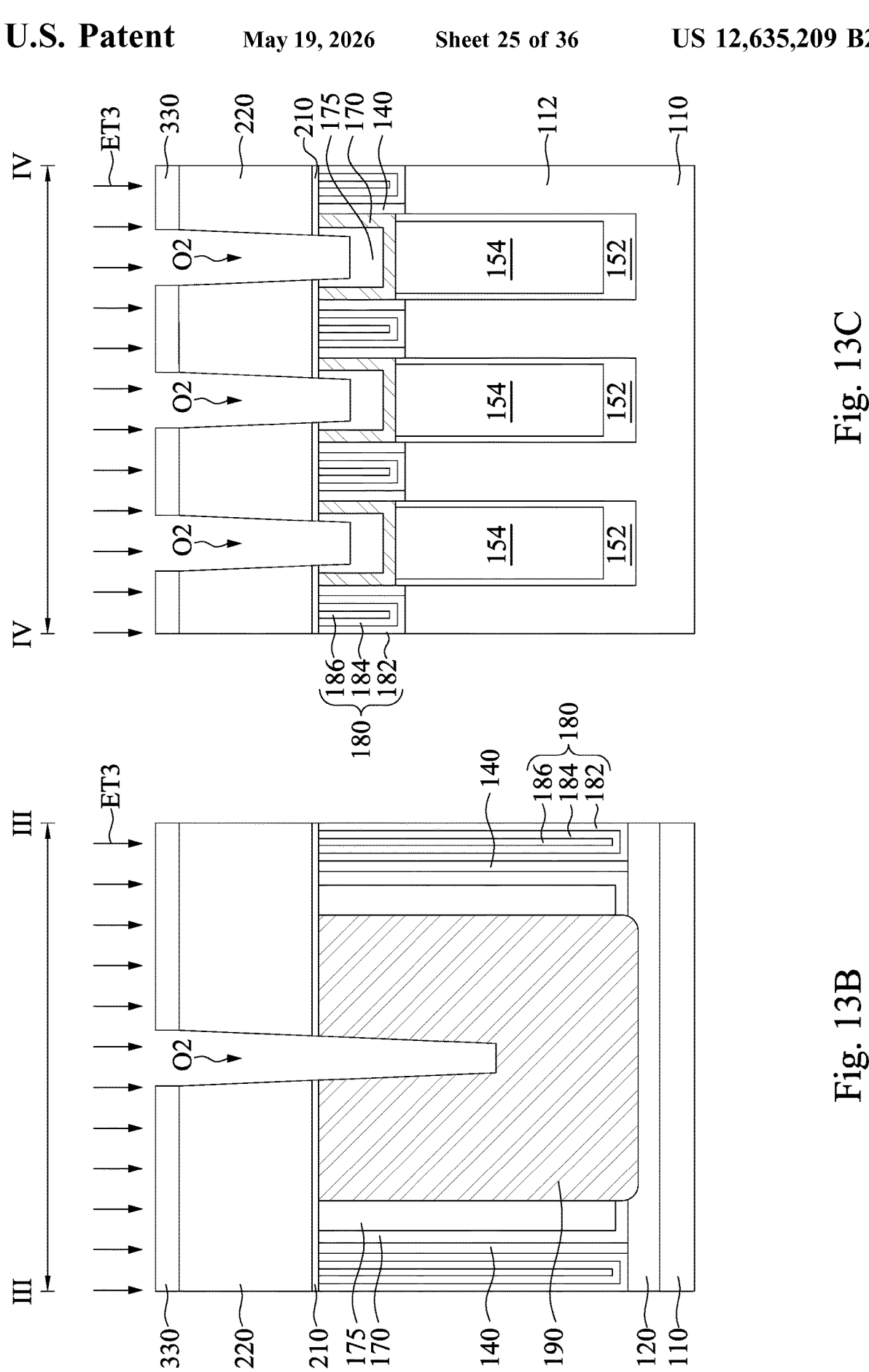

In some embodiments, the OIEB etching process ET4 is an anisotropic etching process, such as a plasma etching (e.g., inductively coupled plasma (ICP), capacitively coupled plasma (CCP), or the like), using a different etchant and/or etching conditions than the NPB etching process ET2. The etchant and/or etching conditions of the OIEB etching process ET4 are selected in such a way that the nitride material (e.g., the dielectric structure 190 and the CESL 170) exhibits a slower etch rate than the oxide material (e.g., the first ILD layer 175). Stated differently, the dielectric structure 190 and the CESL 170 have higher etch resistances than the first ILD layer 175 in the OIEB etching process ET4. In this way, the CESL 170 can inhibit or slow down the etching in the CESL 170 during the OIEB etching process ET4. Take plasma etching for example, the semiconductor substrate 110 having the structure illustrated in FIG. 13A is loaded into a plasma tool and exposed to a plasma environment generated by RF or microwave power in a gaseous mixture of a fluorine-containing gas (e.g., $C_4F_6$, $C_4F_8$), or similar species), an oxygen-containing gas (e.g., $O_2$), a nitrogen-containing gas (e.g., $N_2$), and an inert gas (e.g., argon or helium), for a duration time sufficient to remove the portions of the first ILD layer 175 directly above the first source/drain epitaxial structure 150 and the second source/drain epitaxial structure 160. The plasma etching environment has a pressure between about 3 mTorr and 100 mTorr and the plasma is generated by RF power between about 0 Watts and 500 Watts with plasma frequency in a range from about 0.8 MHz to about 60 Hz. That is, the OIEB etching process ET4 may be similar to the contact etching process ET1. That is, a hydrogen concentration of a gas mixture used in the NPB etching process ET2 is higher than a hydrogen concentration of a gas mixture used in the OIEB etching process ET4.

Figure 14A:
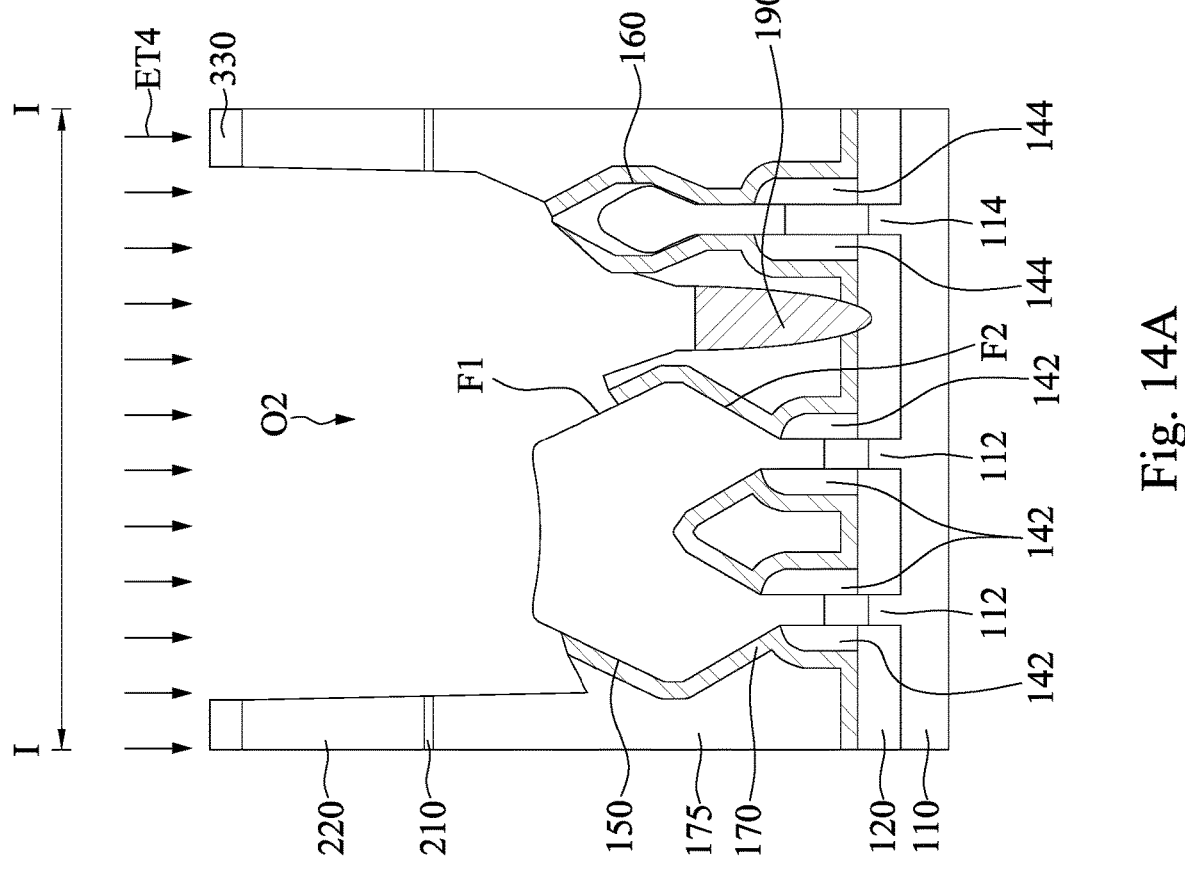
Figures 14B, 14C:
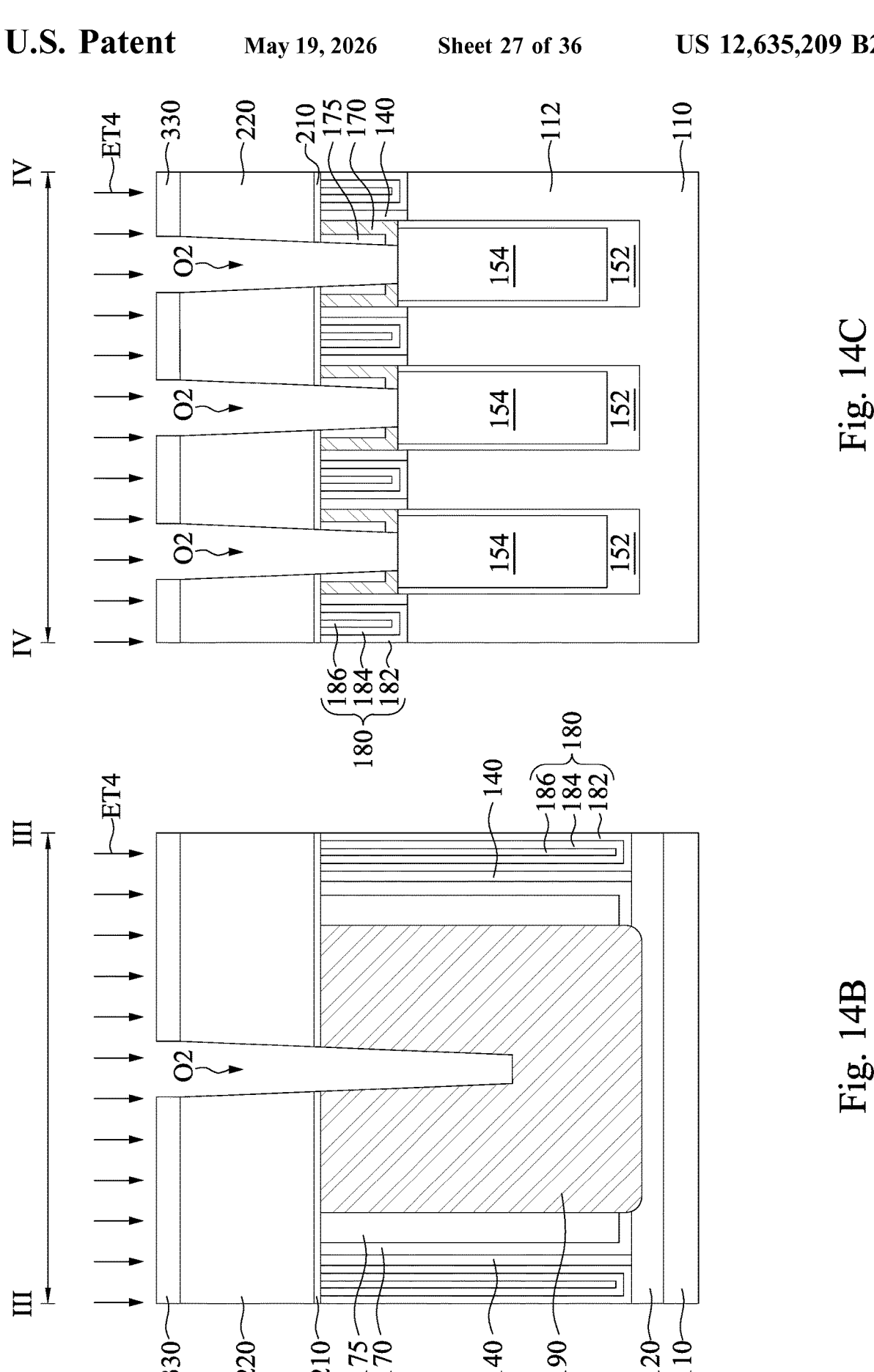

In FIG. 14A, even the CESL 170 has a high etch resistance during the OIEB etching process ET4, the etching gas used in the OEB etching process ET4 may still etches the CESL 170 to expose the underlying source/drain epitaxial structures 150 and 160. However, the top surface of the source/drain epitaxial structures 150 and 160 may still be mostly covered by the CESL 170. Specifically, in FIG. 14A, the source/drain epitaxial structure 150 has a first facet F1 and a second facet F2 both facing the dielectric structure 190. The first facet F1 is over and higher than the second facet F2. After the OIEB etching process ET4, the first facet F1 is partially exposed by the CESL 170 and the first ILD layer 175, but the second facet F2 is entirely covered by the CESL 170 and the first ILD layer 175. Also, as shown in FIG. 14A, the OIEB etching process ET4 still removes a portion of the dielectric structure 190, such that a vertical thickness of the dielectric structure 190 exposed by the contact opening O2 is reduced.

Reference is made to FIGS. 1 and 15A-15C. A fifth etching process (also called oxide-full-etching-back (OFEB) process) ET5 and a six etching process (also called liner removal (LRM) process) ET6 are sequentially performed. The etching time duration of the OFEB process ET5 and the LRM etching process ET6 are controlled to remove the CESL 170. As a result of the OFEB process ET5 and the LRM etching process ET6, the epitaxial structures (e.g., the first source/drain epitaxial structure 150 and the second source/drain epitaxial structure 160) get exposed at bottoms of the deepened contact openings O2.

Figure 15A:
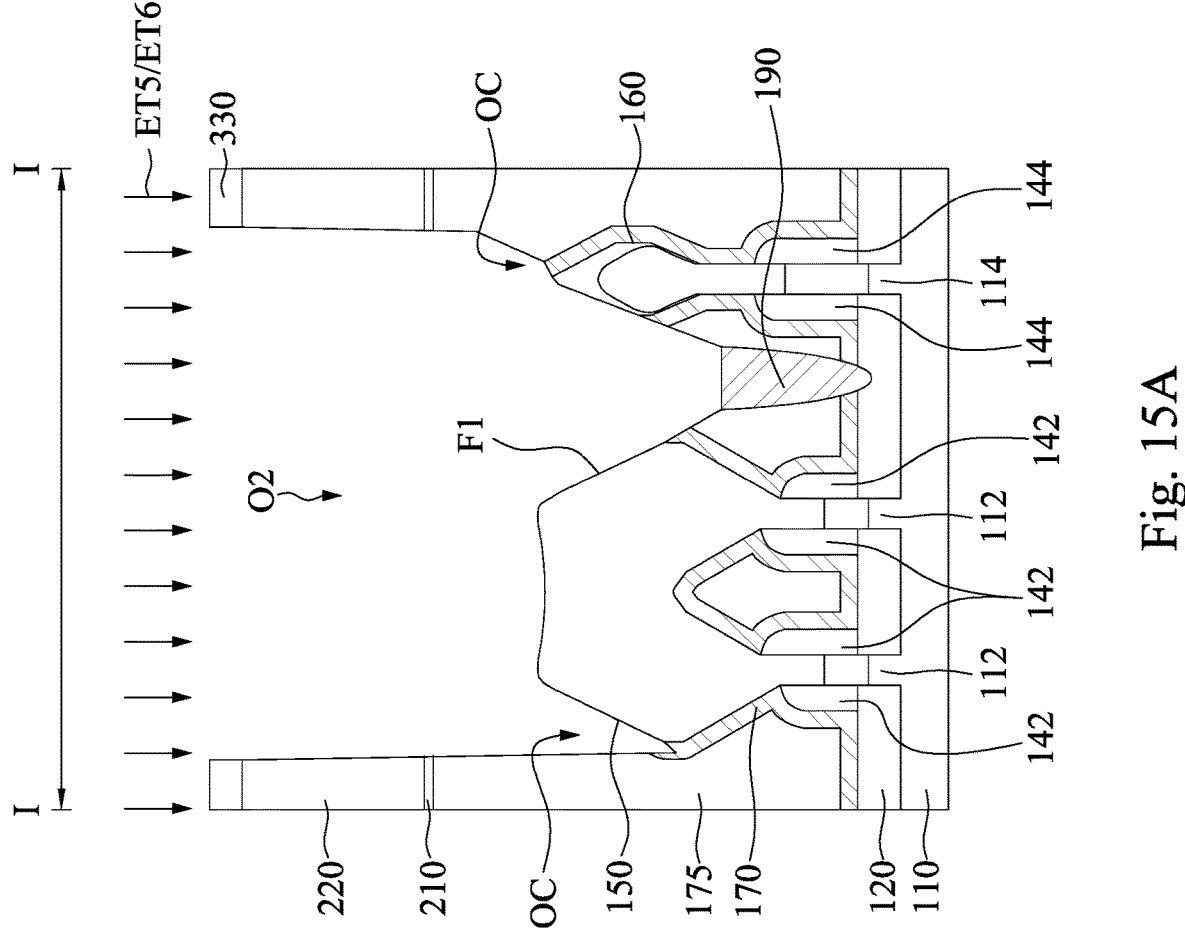
Figures 15B, 15C:
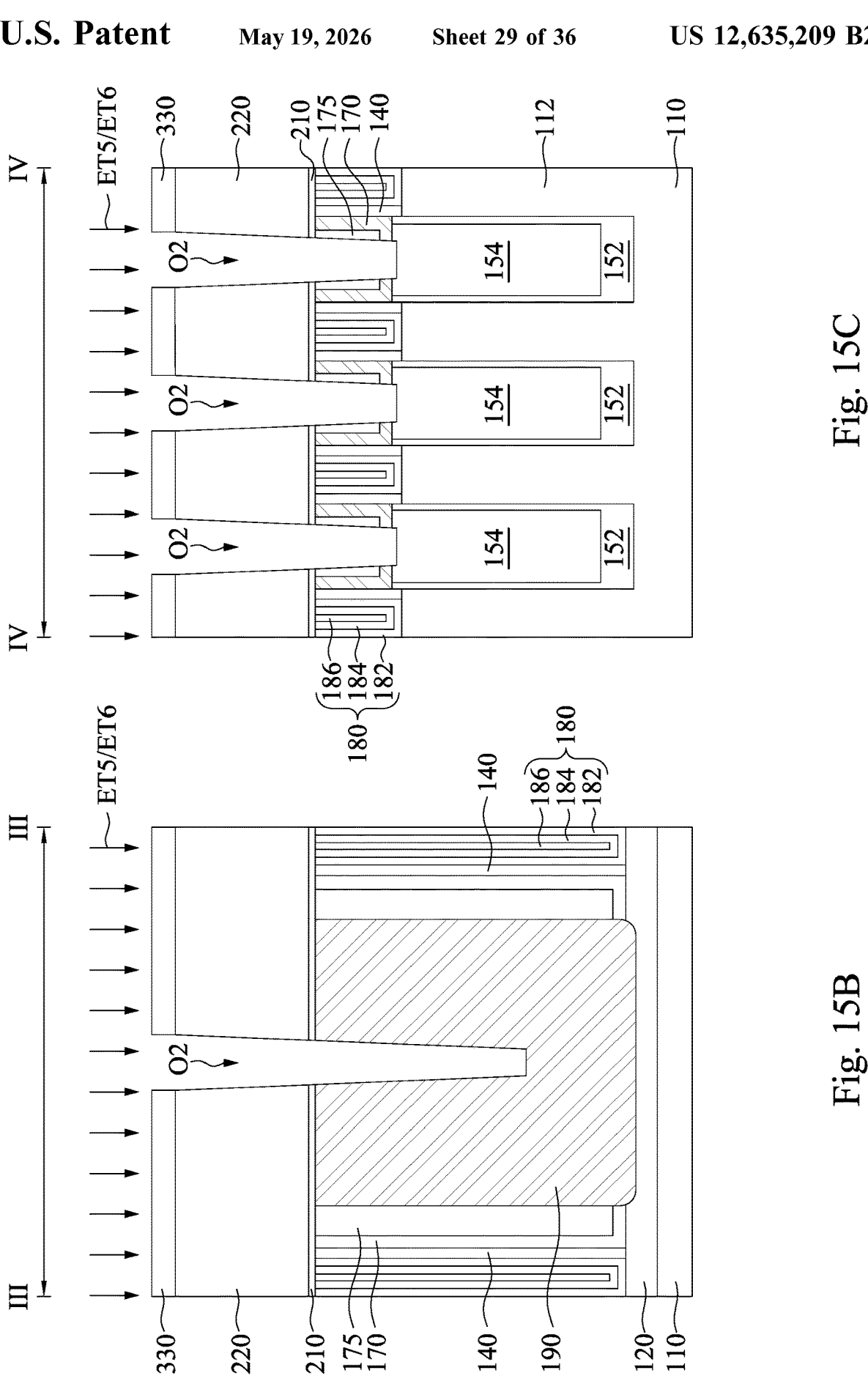

As shown in FIGS. 14A and 15A, since the dielectric structure 190 has been pulled back with the NPB etching process ET2 (see FIGS. 12A-12C), the window for etching the portions of the CESL 170 and the first ILD layer 175 near the dielectric structure 190 is enlarged, and these portions of the CESL 170 and the first ILD layer 175 can be removed effectively. The OFEB process ET5 is performed to etch back these portions of the first ILD layer 175 covering the CESL 170 to increase the exposed surface area of the CESL 170 in the contact openings O2. The LRM etching process ET5 is then performed to remove the portions of the CESL 170 exposed by the contact openings O2. After the LRM etching process ET5, an entirety of the first facet F1 is exposed by the CESL 170. Hence, the first source/drain epitaxial structure 150 and the second source/drain epitaxial structure 160 have large exposed surface areas.

In some embodiments, the OFEB process ET5 is an anisotropic etching processes, such as a plasma etching (e.g., inductively coupled plasma (ICP), capacitively coupled plasma (CCP), or the like), using a different etching conditions than the OIEB etching process ET4. The first ILD layer 175 is over etched at the OFEB process ET5. Take plasma etching for example, the semiconductor substrate 110 having the structure illustrated in FIG. 14A is loaded into a plasma tool and exposed to a plasma environment generated by RF or microwave power in a gaseous mixture of a fluorine-containing gas (e.g., $C_4F_6$, $C_4F_8$), or similar species), an oxygen-containing gas (e.g., $O_2$), a nitrogen-containing gas (e.g., $N_2$), and an inert gas (e.g., argon or helium), for a duration time sufficient to remove the portions of the first ILD layer 175 covering the CESL 170. The plasma etching environment has a pressure between about 3 mTorr and 100 mTorr and the plasma is generated by RF power between about 0 Watts and 500 Watts with plasma frequency in a range from about 0.8 MHz to about 60 Hz.

The gaseous mixture used in the OFEB process ET5 may be similar to or the same as the gaseous mixture used in the OIEB process ET4. However, a plasma power of the OFEB process ET5 is higher than a plasma power of the OIEB process ET4 by about 20 Watts to about 150 Watts. Alternatively or additionally, a plasma frequency of the OFEB process ET5 is higher than a plasma frequency of the OIEB process ET4 by about 20 MHz to about 30 MHz. The high plasma power and/or high plasma frequency leads to a deep etching for oxide materials. That is, the OFEB process ET5 can be used for the etching in a high-aspect-ratio opening region (e.g., the region near the dielectric structure 190 exposed by the contact opening O2).

In some embodiments, the LRM etching process ET6 is an anisotropic etching processes, such as a plasma etching (e.g., inductively coupled plasma (ICP), capacitively coupled plasma (CCP), or the like), using a different etching conditions than the OFEB etching process ET5. The etchant and/or etching conditions of the LRM etching process ET5 are selected in such a way that the oxide material (e.g., the first ILD layer 175) and the semiconductive materials (e.g., the source/drain epitaxial structures 150 and 160) exhibits a slower etch rate than the nitride material (e.g., the dielectric structure 190 and the CESL 170). Take plasma etching for example, the semiconductor substrate 110 is exposed to a plasma environment generated by RF or microwave power in a gaseous mixture of a fluorine-containing gas (e.g., $CH_2F_2$, $CH_3F$, $CF_4$, $C_4F_8$, $C_4F_6$, or similar species), a hydrogen-containing gas (e.g., $H_2$), an oxygen-containing gas (e.g., $O_2$), a nitrogen-containing gas (e.g., $N_2$), and an inert gas (e.g., argon or helium), for a duration time sufficient to remove the portions of the CESL 170 exposed by the contact openings O2. A hydrogen concentration of the gas mixture used in the LRM etching process ET6 is higher than a hydrogen concentration of the gas mixture used in the OFEB etching process ET5. The plasma etching environment has a pressure between about 3 mTorr and 100 mTorr and the plasma is generated by RF power between about 0 Watts and 500 Watts with plasma frequency in a range from about 0.8 MHz to about 60 Hz.

In FIG. 15A, portions of the CESL 170 are removed such that the top surfaces of the first source/drain epitaxial structure 150 and the second source/drain epitaxial structure 160 are exposed. In some embodiments, the LRM etching process ET6 further etches the first source/drain epitaxial structure 150 and the second source/drain epitaxial structure 160. Also, as shown in FIG. 15A, the LRM etching process ET6 removes another portion of the dielectric structure 190, such that a vertical thickness of the dielectric structure 190 exposed by the contact opening O2 is further reduced.

Reference is made to FIGS. 1 and 16A-16D. The patterned mask layer 330 (see FIGS. 15A-15C) is removed. Metal alloy layers 230 are respectively formed above the first source/drain epitaxial structures 150 and the second source/drain epitaxial structures 160. The metal alloy layers 230, which may be silicide layers, are respectively formed in the trenches and over the exposed first source/drain epitaxial structures 150 and the second source/drain epitaxial structures 160 by a self-aligned silicide (salicide) process. The silicide process converts the surface portions of the exposed first source/drain epitaxial structures 150 and second source/drain epitaxial structures 160 into the silicide contacts. Silicide processing involves deposition of a metal that undergoes a silicidation reaction with silicon (Si). In order to form silicide contacts on the exposed first source/drain epitaxial structures 150 and second source/drain epitaxial structures 160, a metal material is blanket deposited on the exposed first source/drain epitaxial structures 150 and second source/drain epitaxial structures 160. After heating the wafer to a temperature at which the metal reacts with the silicon of the exposed first source/drain epitaxial structures 150 and second source/drain epitaxial structures 160 to form contacts, unreacted metal is removed. The silicide contacts remain over the exposed first source/drain epitaxial structures 150 and second source/drain epitaxial structures 160, while unreacted metal is removed from other areas. The silicide layer may include a material selected from titanium silicide, nickel silicide, cobalt silicide, platinum silicide, nickel platinum silicide, erbium silicide, palladium silicide, combinations thereof, or other suitable materials. In some embodiments, the front-side metal alloy layers may include germanium.

Source/drain contacts 240 are then formed in the contact openings O2 and above the metal alloy layers 230. As such, the source/drain contacts 240 are electrically connected to the first source/drain epitaxial structures 150 and/or the second source/drain epitaxial structures 160. In some embodiments, each of the source/drain contacts 240 includes a barrier layer 242 and a fill metal 244. The barrier layer 242 may be made of Ti, TiN, Ta, TaN, Ru, Co, or combinations thereof. The fill metal 244 may be made of metal, such as W, Co, Ru, Mo, Al, Cu, or other suitable materials. In some embodiments, the barrier layer 242 has a thickness in a range from about 5 angstrom to about 50 angstrom. After the deposition of the source/drain contacts 240, a planarization process, such as a chemical mechanical planarization (CMP) process, may be then performed.

Figures 16A, 16B:
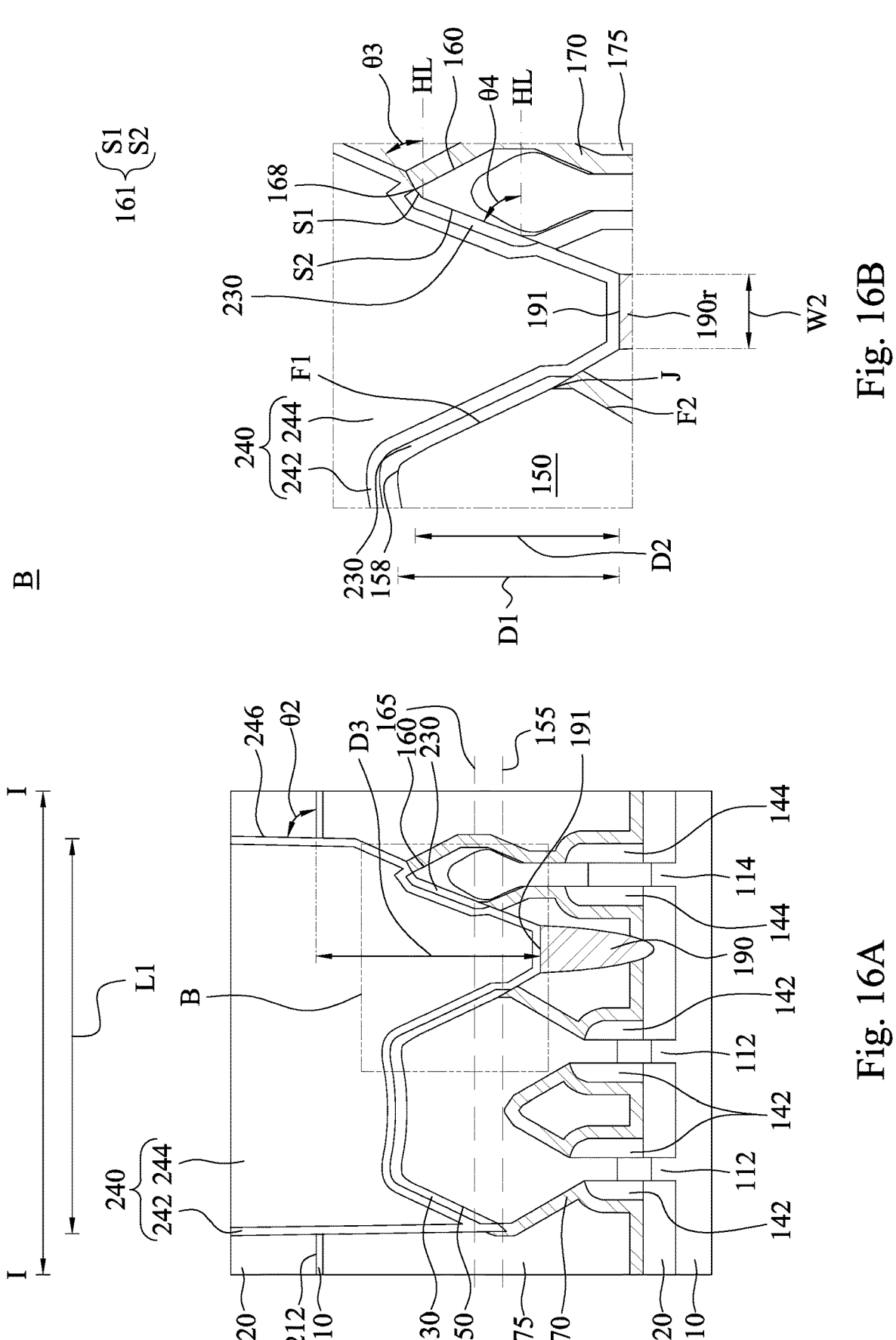

In FIGS. 1 and 16A, the semiconductor device 100 includes the semiconductor fins 112 and 114, the first source/drain epitaxial structures 150, the second source/drain epitaxial structure 160, the gate structures 180' (180), the dielectric structure 190, and the source/drain contacts 240. The semiconductor fins 112 and 114 and the dielectric structure extend in the X direction in the top view (FIG. 1), and the gate structures 180/180' and the source/drain contacts 240 extend in the Y direction in the top view.

The first source/drain epitaxial structures 150 are over the source/drain regions of the semiconductor fins 112, respectively. The second source/drain epitaxial structure 160 is over the source/drain region of the semiconductor fin 114. One of the gate structures 180' is across the semiconductor fins 112, and another one of the gate structures 180' is across the semiconductor fin 114. The two adjacent gate structures 180' are separated from each other by the dielectric structure 190. The dielectric structure 190 further extends between the first source/drain epitaxial structures 150 and the second source/drain epitaxial structure 160 but spaced apart from the semiconductor fins 112 and 114. That is, a recessed portion 190r (see FIG. 16B) of the dielectric structure 190 is directly between the source/drain epitaxial structures 150 and 160.

Figures 16C, 16D:
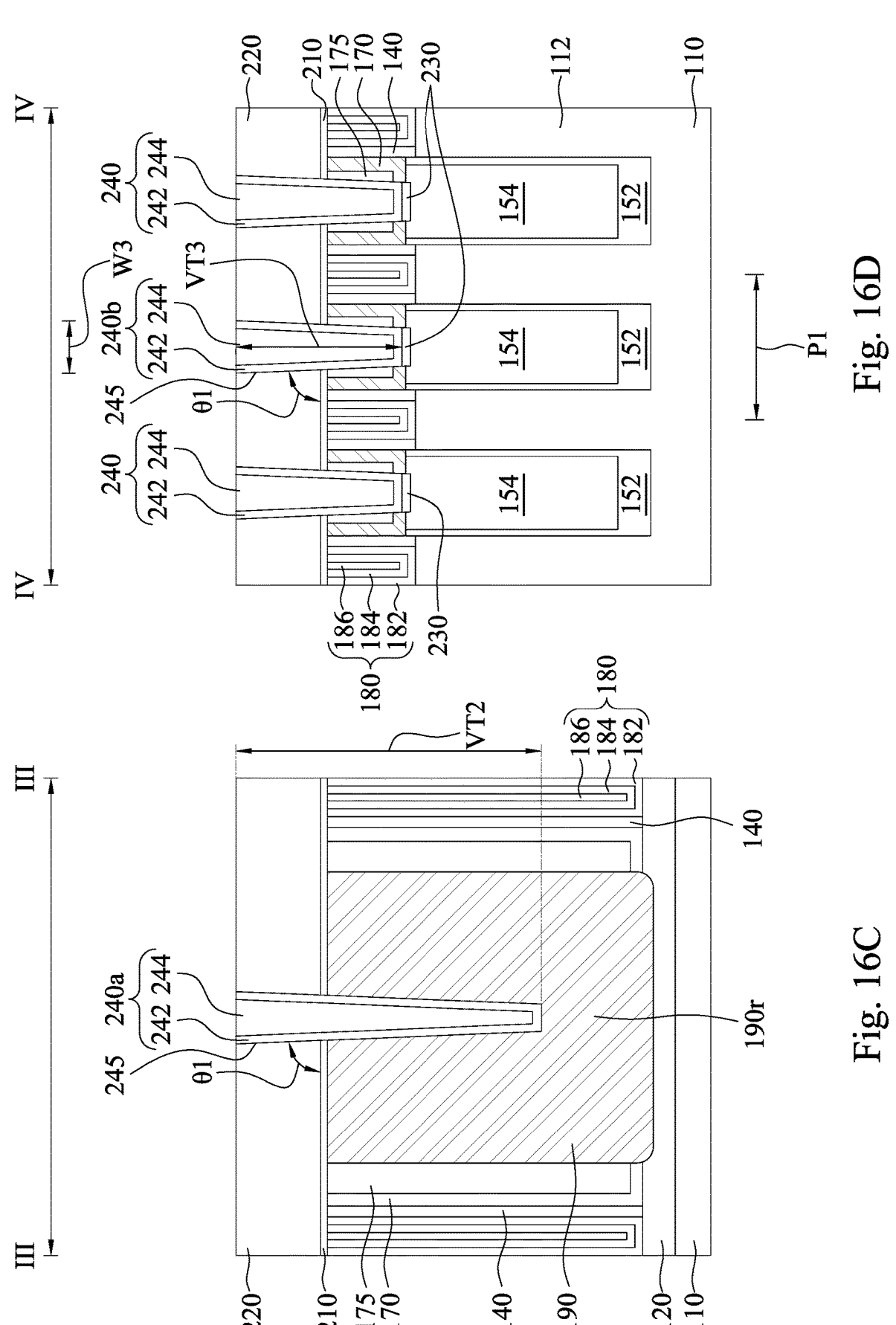

Reference is made to FIGS. 16C and 16D. The source/drain contact 240 is electrically connected to the source/drain epitaxial structures 150 and 160. Further, the source/drain contact 240 is in contact with the recessed portion 190r of the dielectric structure 190. The source/drain contact 240 includes a first portion 240a directly over the recessed portion 190r of the dielectric structure 190 and a second portion 240b directly over the source/drain epitaxial structure 150. A vertical thickness VT2 of the first portion 240a is greater than a vertical thickness VT3 of the second portion 240b.

FIG. 16B is an enlarged view of the area B in FIG. 16A. Reference is made to FIGS. 16A and 16B. The first source/drain epitaxial structure 150 has a largest horizontal width at a level (or position) 155, and the recessed portion 190r of the dielectric structure 190 has the top surface 191 lower than or substantially coplanar with the level 155. Stated differently, an interface (i.e., the top surface 191) between the recessed portion 190r of the dielectric structure 190 and the source/drain contact 240 is lower than a joint J of the first facet F1 and the second facet F2. Further, the second source/drain epitaxial structure 160 has a largest horizontal width at a level (or position) 165, and the top surface 191 is lower than or substantially coplanar with the position 165. With such configuration, portions of the CESL covering the top surfaces of the first source/drain epitaxial structures 150 and the second source/drain epitaxial structure 160 can be sufficiently removed, and the contact area between the source/drain contact 240 and the metal alloy layers 230 (and thus the first source/drain epitaxial structures 150 or the second source/drain epitaxial structure 160) is enlarged. Therefore, the electrical resistance of the source/drain contact 240 can be reduced.

In some embodiments, as shown in FIG. 16D, the source/drain contact 240 has a width W3 in a range from about 12 nm to about 45 nm. For example, the width W3 is in a range from about 12 nm to about 18 nm with a gate pitch P1 in a range from about 46 nm to about 50 nm. As shown in FIGS. 16C and 16D, an angle θ1 is formed between a sidewall 245 of the source/drain contact 240 and the MCESL 210, and may be in a range from about 86 degrees to about 90 degrees. Further, as shown in FIG. 16A, the source/drain contact 240 has a length L1 in a range from about 20 nm to about 500 nm, depending on the layout design of the semiconductor device 100. An angle θ2 is formed between a sidewall 246 of the source/drain contact 240 and the MCESL 210, and may be in a range from about 85 degrees to about 90 degrees. The angle θ2 may be varied depending on the length L1 of the source/drain contact 240. For example, for a source/drain contact 240 with a short length L1 (e.g., less than about 100 nm), the angle α2 may be large (e.g., from about 87 degrees to about 90 degrees); for a source/drain contact 240 with a long length L1 (e.g., greater than about 100 nm), the angle θ2 may be small (e.g., from about 85 degrees to about 86 degrees).

Reference is made to FIG. 16B. In some embodiments, a vertical distance D1 is between the topmost position 158 of the first source/drain epitaxial structures 150 and the top surface 191 of the recessed portion 190r of the dielectric structure 190, and a vertical distance D2 is between the topmost position 168 of the second source/drain epitaxial structure 160 and the top surface 191 of the recessed portion 190r of the dielectric structure 190. A difference between the vertical distances D1 and D2 is smaller than about 5 nm, i.e., in a range from 0 nm to about 5 nm. In some embodiments, each of the vertical distances D1 and D2 equals to "a(W2)+ b", where a is in a range from about 0.7 to about 1.9, and b is in a range from about 3 to about 11. Further, as shown in FIG. 16A, a vertical distance D3 between the top surface 191 of the recessed portion 190r of the dielectric structure 190 and the MCESL 210 is in a range from about 30 nm to about 70 nm.

In some embodiments, as shown in FIG. 16B, due to the over-etching of the source/drain epitaxial structures in the LRM etching process ET6, an interface 161 between the metal alloy layer 230 and the second source/drain epitaxial structure 160 has different slopes in the cross-sectional view. For example, an upper portion S1 of the interface 161 has a first slope and a lower portion S2 of the interface 161 has a second slope steeper than the first slope. The lower portion S2 is closer to the dielectric structure 190 than the upper portion S1 is. Further, an angle θ3 between the upper portion S1 and a horizontal line HL, which is substantially coplanar with a top surface 212 (labeled in FIG. 16A) of the MCESL 210, is in a range from about 0 degree to about 40 degrees, and an angle θ4 between the lower portion S2 and the horizontal line HL is in a range from about 30 degree to about 90 degrees.

The slope difference may be due to different etching rates at different areas of the contact openings O2. Specifically, as shown in FIG. 15A, the LRM process ET6 produces polymers in the contact openings O2. The polymers may be accumulated at corner areas OC of the contact openings O2 and thus slow down the etching rate near the corner areas OC. On contrary, the areas near the recessed dielectric structure 190 has large window for etching, such that portions of the second source/drain epitaxial structure 160 (and the first source/drain epitaxial structure 150) near the recessed dielectric structure 190 are etched faster.

Figure 17:
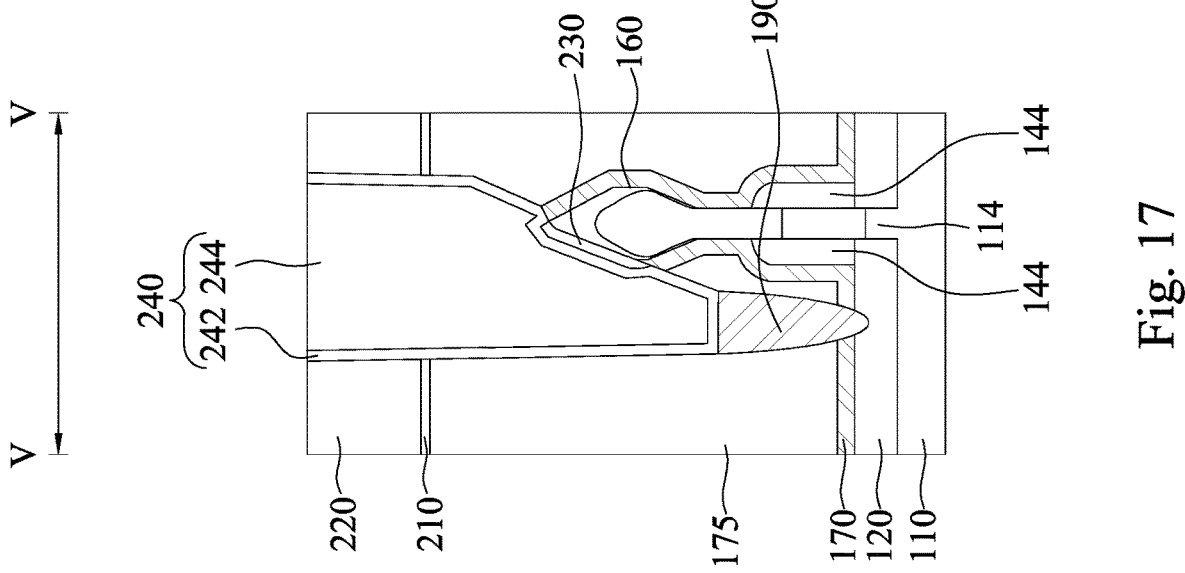
FIG. 17 is a cross-sectional view of the semiconductor device in FIG. 1 along a fifth cut (e.g., cut V-V).

FIG. 17 is a cross-sectional view of the semiconductor device 100 in FIG. 1 along a fifth cut (e.g., cut V-V). In some embodiments, the dielectric structure 190 may be formed adjacent to a single semiconductor fin 114 (or 112). Therefore, the source/drain contact 240 in FIG. 17 is connected to the second source/drain epitaxial structure 160 and is not connected to the first source/drain epitaxial structure(s) 150, or vice versa.

Figure 18:
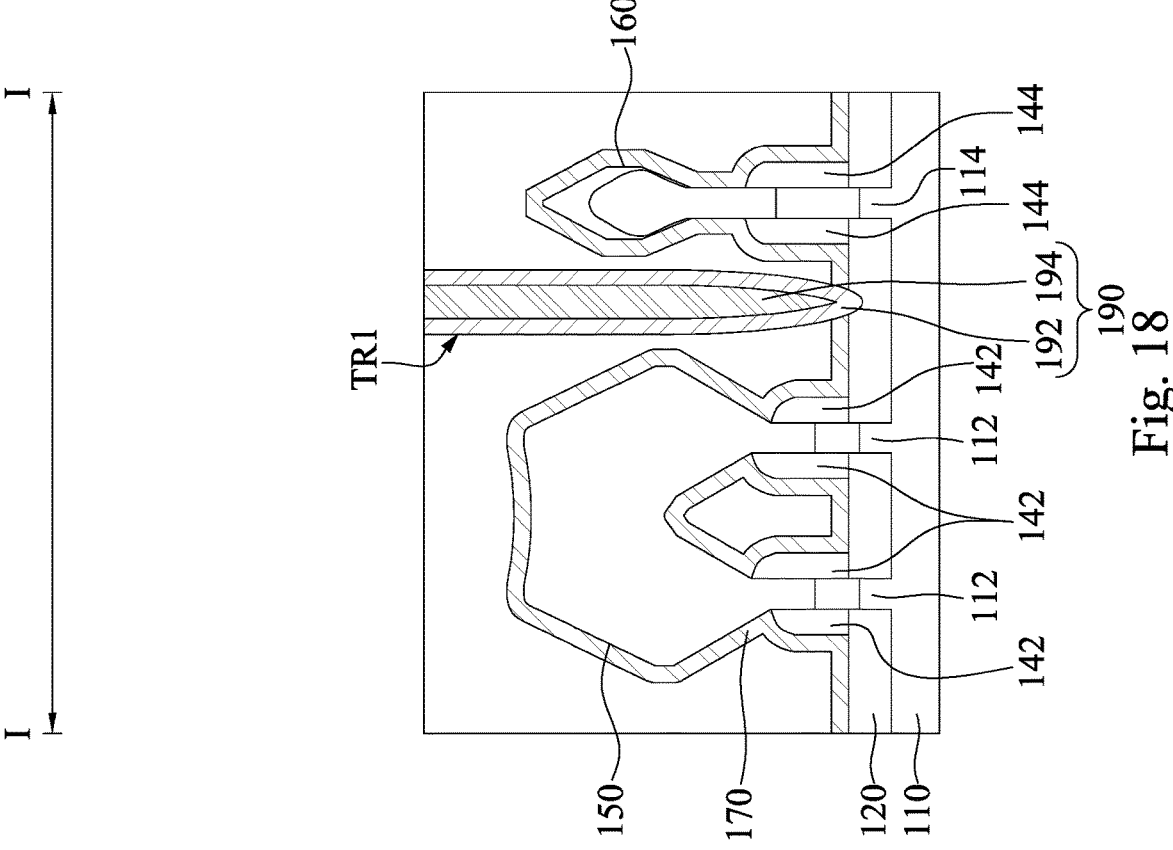
FIGS. 18-24 illustrate a method for manufacturing the semiconductor device (or the integrated circuit structure) at various stages in accordance with some embodiments of the present disclosure.

FIGS. 18-24 illustrate a method for manufacturing the semiconductor device (or the integrated circuit structure) 100 at various stages in accordance with some embodiments of the present disclosure. In some embodiments, the dielectric structure 190 includes multiple layers. For example, after the formation of the gate structures 180 as shown in FIGS. 8A-8D, the trenches TR1 are formed to cut the gates structure 180 into gates structures 180'. Subsequently, as shown in FIG. 18, a first dielectric layer 192 is conformally deposited in the trenches TR1, and a second dielectric layer 194 is deposited on the first dielectric layer 192 to fill the trenches TR1. That is, the first dielectric layer 192 warps the second dielectric layer 194, and the second dielectric layer 194 is embedded in the first dielectric layer 192. After the deposition of the second dielectric layer 194, a planarization process, such as a chemical mechanical planarization (CMP) process, may be then performed. The first dielectric layer 192 and the second dielectric layer 194 may be SiO, SiN, SiOC, SiOCN, or combinations thereof. The first dielectric layer 192 and the second dielectric layer 194 include different materials. For example, the first dielectric layer 192 is a nitride-rich layer (e.g., silicon nitride), and the second dielectric layer 194 is an oxide-rich layer (e.g., silicon oxide).

Figures 19, 20:
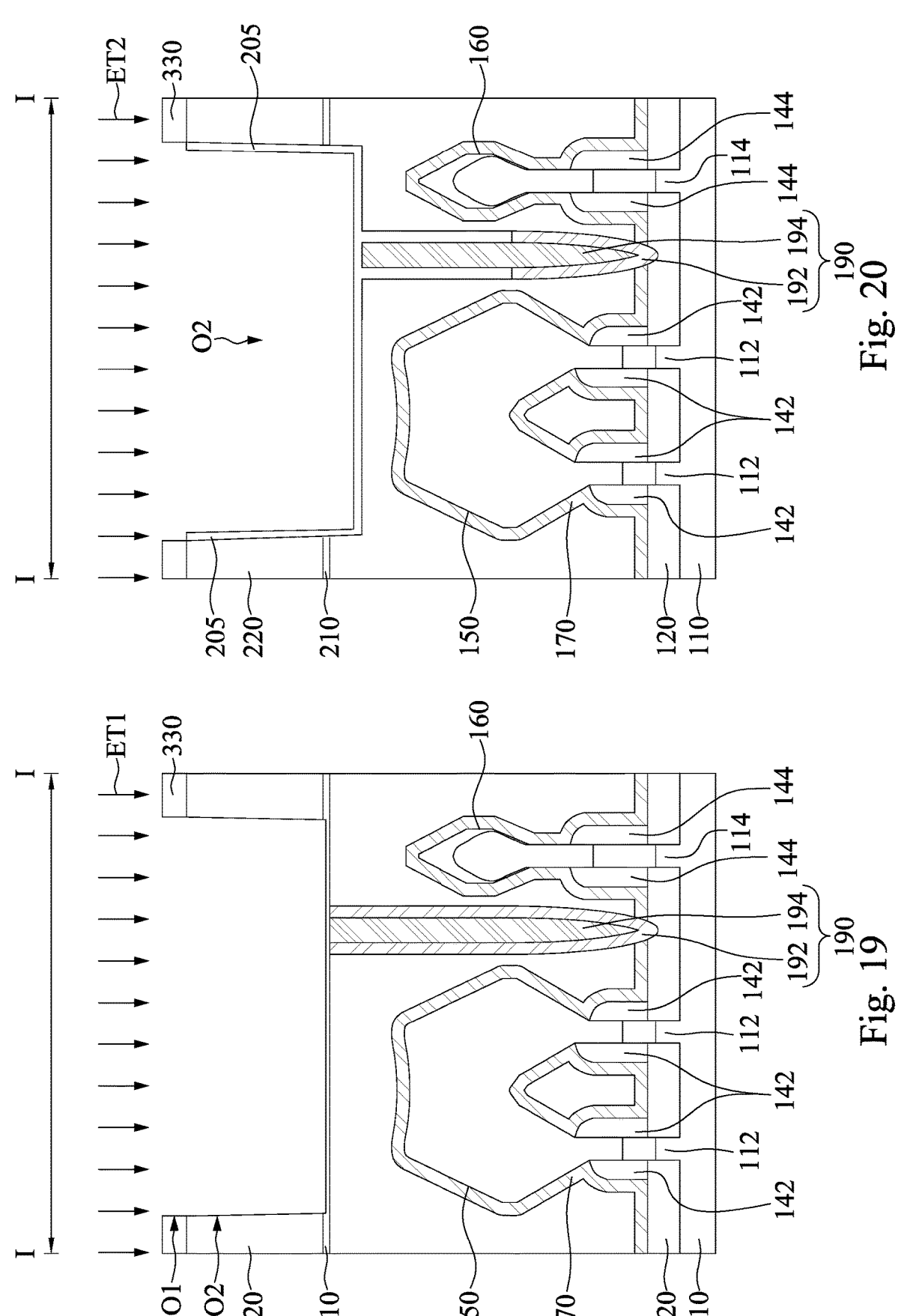

In FIG. 19, the MCESL 210 and the second ILD layer 220 are formed over the structure illustrated in FIG. 18. Subsequently, the patterned mask layer 330 is formed over the second ILD layer 220, and the contact etching process ET1 is performed to form the contact openings O2 in the second ILD layer 220 and the MCESL 210. The contact opening O2 exposes the first ILD layer 175 and the dielectric structure 190.

In FIG. 20, the NPB etching process ET2 is performed. Due to the material difference between the first dielectric layer 192 and the second dielectric layer 194, the first dielectric layer 192 is etched during the NPB etching process ET2 while the second dielectric layer 194 is not etched or barely etched. As such, a top surface of the second dielectric layer 194 is higher than a top surface of the first dielectric layer 192 after the NPB etching process ET2. Further, as mentioned above, the NPB etching process ET2 also produces polymer layers 205 on surfaces of the first ILD layer 175 (and the second dielectric layer 194).

Figures 21, 22:
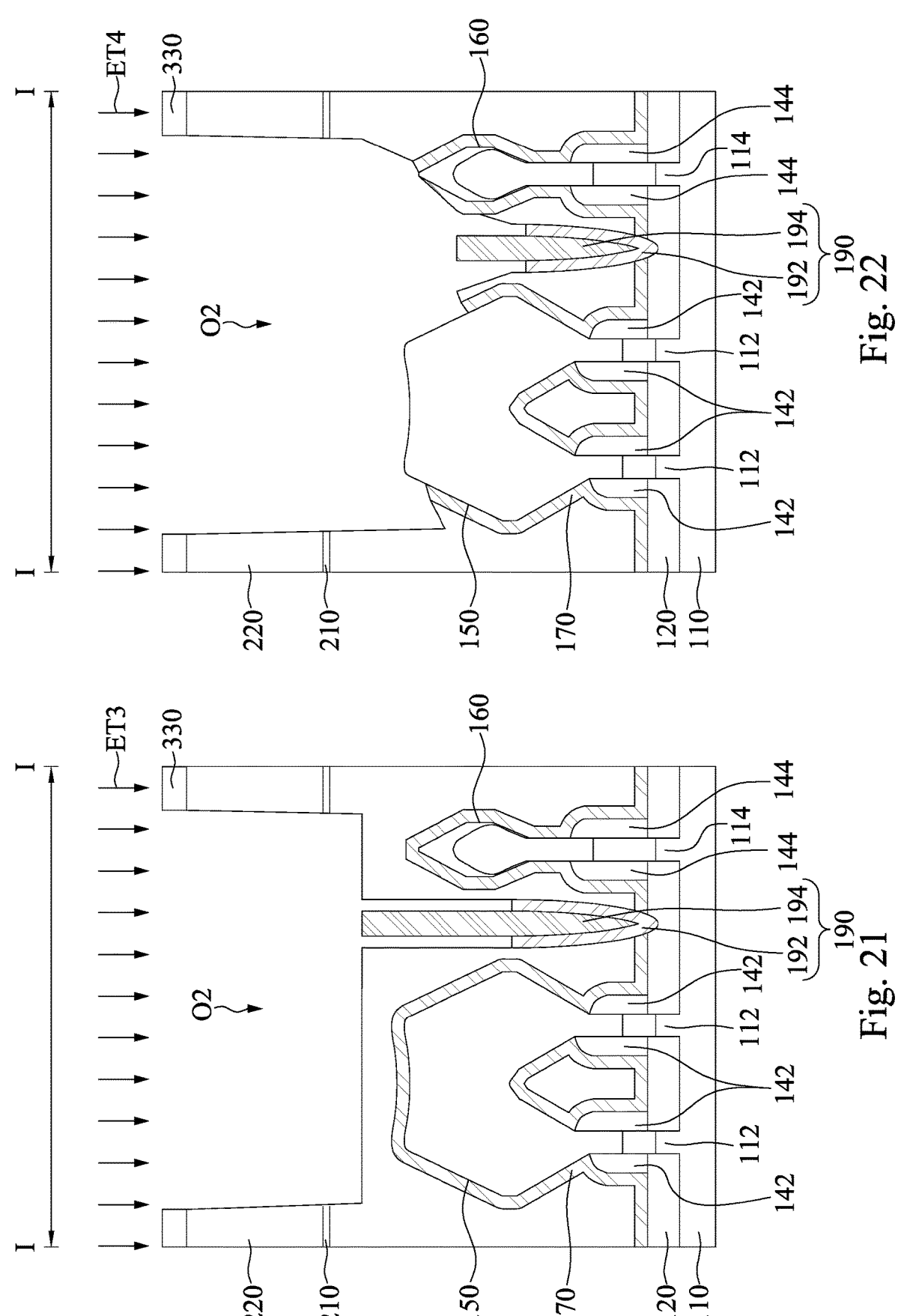
Figures 23, 24:
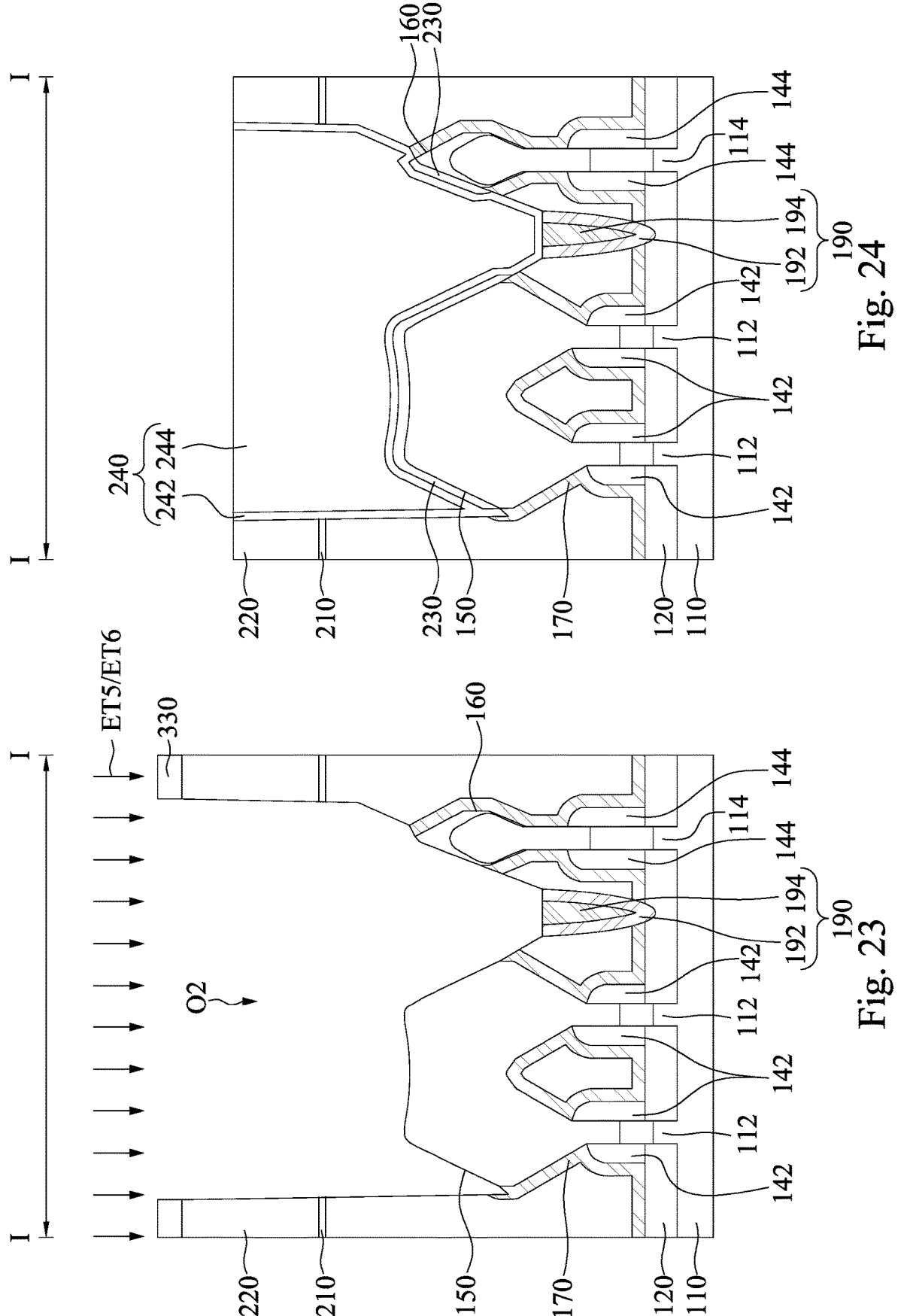

In FIG. 21, the polymer removal process ET3 is performed to remove the polymer layer 205. In FIG. 22, the OIEB etching process ET4 is performed to etch back the exposed portion of the first ILD layer 175 and the second dielectric layer 194. The first dielectric layer 192 is slightly etched back. Further, the CESL 170 is also etched to expose the first source/drain epitaxial structures 150 and/or the second source/drain epitaxial structure 160. In FIG. 23, the OFEB etching process ET5 and the LRM etching process ET6 are sequentially performed to remove portions of the CESL 170. During the OFEB etching process ET5 and LRM etching process ET6, the first dielectric layer 192 and the second dielectric layer 194 are also etched back. In FIG. 24, the patterned mask layer 330 (see FIG. 23) is removed. The metal alloy layers 230 and the source/drain contacts 240 are formed in sequence.

Figures 25A, 25B:
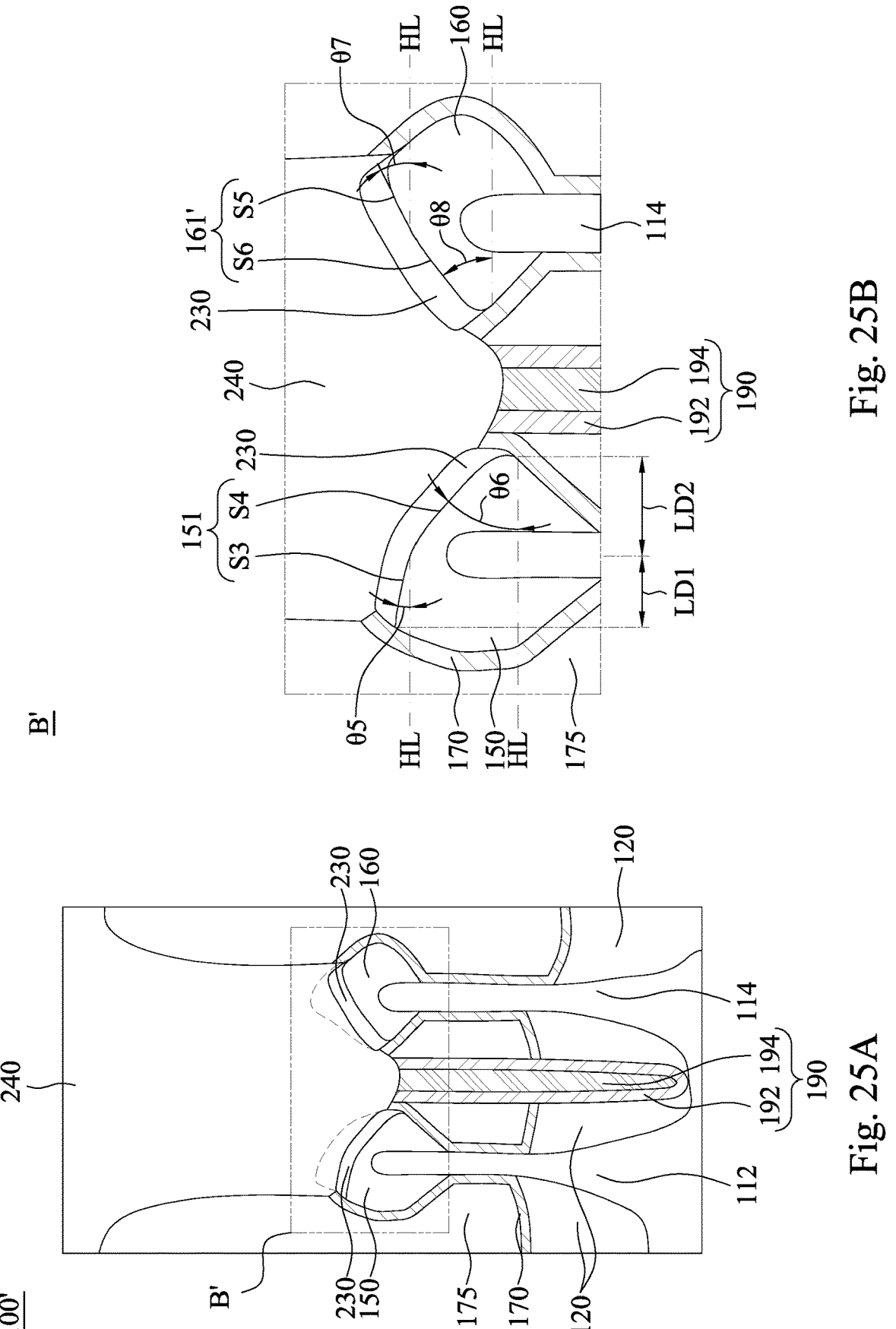
FIG. 25A is a cross-sectional view of a semiconductor device in accordance with some embodiments.
FIG. 25B is an enlarged view of the area B' in FIG. 25A.

FIG. 25A is a cross-sectional view of a semiconductor device 100' in accordance with some embodiments, and FIG. 25B is an enlarged view of the area B' in FIG. 25A. In some embodiments, the dielectric structure 190 may be formed between two adjacent semiconductor fins 112 and 114. The source/drain epitaxial structures 150 and 160 are formed over the semiconductor fins 112 and 114, respectively. The dielectric structure 190 including the first dielectric layer 192 and the second dielectric layer 194 is formed between the source/drain epitaxial structures 150 and 160 to cut the gate structures. In some embodiments, the source/drain epitaxial structures 150 and 160 may be etched during the LRM etching process ET6 (see FIGS. 15A-15C), and the original profiles of the source/drain epitaxial structures 150 and 160 are illustrated in dashed lines.

As shown in FIG. 25B, an interface 151 between the metal alloy layer 230 and the source/drain epitaxial structure 150 has different slopes in the cross-sectional view. For example, an upper portion S3 of the interface 151 has a first slope and a lower portion S4 of the interface 151 has a second slope steeper than the first slope. Further, an angle θ5 between the upper portion S3 and a horizontal line HL, which is substantially coplanar with a top surface of the semiconductor device 100', is in a range from about 0 degree to about 40 degrees, and an angle θ6 between the lower portion S4 and the horizontal line HL is in a range from about 30 degree to about 90 degrees.

Further, a projection of the upper portion S3 on the horizontal line HL has a lateral length LD1, and a projection of the upper portion S4 on the horizontal line HL has a lateral length LD2. The length of the upper portion S3 in the cross-sectional view is in a range from about 1 to about 1.5 times of the length LD1, and the length of the lower portion S4 in the cross-sectional view is in a range from about 1.1 to about 2 times of the length LD2.

Similarly, an interface 161' between the metal alloy layer 230 and the source/drain epitaxial structure 160 has different slopes in the cross-sectional view. For example, an upper portion S5 of the interface 161' has a first slope and a lower portion S6 of the interface 161' has a second slope steeper than the first slope. Further, an angle θ7 between the upper portion S5 and the horizontal line HL is in a range from about 0 degree to about 40 degrees, and an angle θ8 between the lower portion S6 and the horizontal line HL is in a range from about 30 degree to about 90 degrees. Other features of the semiconductor device 100' are similar to or the same as those of the semiconductor device 100 shown in FIGS. 1 and 16A-16D, and therefore, a description in this regard will not be provided hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the recessed dielectric structure enlarges the etching window for etching the CESL covering the source/drain epitaxial structures, such that the CESL can be efficiently removed to expose large surface areas of the source/drain epitaxial structures. Therefore, the metal alloy layer can be formed with a large area. Another advantage is that the recessing of the dielectric structure allows the source/drain contact to extend further downwards, such that the source/drain contact have large contact area to the metal alloy layer and thus the electrical resistance therebetween is reduced.

According to some embodiments, a method includes forming a dummy gate over a semiconductor fin; forming a source/drain epitaxial structure over the semiconductor fin and adjacent to the dummy gate; depositing an interlayer dielectric (ILD) layer to cover the source/drain epitaxial structure; replacing the dummy gate with a gate structure; forming a dielectric structure to cut the gate structure, wherein a portion of the dielectric structure is embedded in the ILD layer; recessing the portion of the dielectric structure embedded in the ILD layer; after recessing the portion of the dielectric structure, removing a portion of the ILD layer over the source/drain epitaxial structure; and forming a source/drain contact in the ILD layer and in contact with the portion of the dielectric structure.

According to some embodiments, a method includes forming a transistor, which includes a gate structure, a source/drain epitaxial structure adjacent to the gate structure, a contact etch stop layer (CESL) covering the source/drain epitaxial structure, and a first interlayer dielectric (ILD) layer covering the CESL, over a substrate; forming a dielectric structure over the substrate, wherein the dielectric structure is in contact with the gate structure and partially embedded in the first ILD layer; forming a second ILD layer over the transistor and the dielectric structure; forming a contact opening in the second ILD layer and over the dielectric structure; performing a first etching process to deep the contact opening, wherein the first etching process etches the dielectric structure faster than etches the first ILD layer; performing a second etching process to further deep the contact opening and expose the source/drain epitaxial structure; and forming a source/drain contact in the contact opening.

According to some embodiments, a device includes a semiconductor fin, a gate structure, a source/drain epitaxial structure, a dielectric structure, and a source/drain contact. The semiconductor fin is over a substrate and extends in a first direction in a top view. The gate structure is across the semiconductor fin and extends in a second direction different from the first direction in the top view. The source/drain epitaxial structure is over the semiconductor fin. The dielectric structure is in contact with the gate structure, is spaced apart from the semiconductor fin, and extends in the first direction in the top view. The source/drain contact is electrically connected to the source/drain epitaxial structure and extends in the second direction in the top view. A first portion of the source/drain contact directly over the dielectric structure has a vertical thickness greater than a vertical thickness of a second portion of the source/drain contact directly over the source/drain epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a dummy gate over a semiconductor fin;
forming a source/drain epitaxial structure over the semiconductor fin and adjacent to the dummy gate;
depositing an interlayer dielectric (ILD) layer to cover the source/drain epitaxial structure;
replacing the dummy gate with a gate structure;
forming a dielectric structure to cut the gate structure, wherein a portion of the dielectric structure is embedded in the ILD layer;
recessing the portion of the dielectric structure embedded in the ILD layer;
removing polymers formed on surfaces of the ILD layer after recessing the portion of the dielectric structure;
after recessing the portion of the dielectric structure, removing a portion of the ILD layer over the source/drain epitaxial structure; and
forming a source/drain contact in the ILD layer and in contact with the portion of the dielectric structure.

2. The method of claim 1, wherein recessing the portion of the dielectric structure embedded in the ILD layer is performed until a top surface of the portion of the dielectric structure is lower than or substantially coplanar with a level at which the source/drain epitaxial structure has a largest horizontal width.

3. The method of claim 1, wherein removing the polymers formed on surfaces of the ILD layer is further performed prior to removing the portion of the ILD layer over the source/drain epitaxial structure.

4. The method of claim 1, wherein the source/drain epitaxial structure has a first facet and a second facet both facing the dielectric structure, the first facet is over the second facet, and removing the portion of the ILD layer over the source/drain epitaxial structure is such that the first facet is exposed while the second facet is covered by the ILD layer.

5. The method of claim 1, wherein the source/drain epitaxial structure has a first facet and a second facet both facing the dielectric structure, the first facet is over the second facet, and an interface between the portion of the dielectric structure and the source/drain contact is lower than a joint of the first facet and the second facet.

6. The method of claim 1, wherein the dielectric structure comprises:
an oxide-rich layer; and
a nitride-rich layer wrapping the oxide-rich layer.

7. The method of claim 1, wherein removing the polymers is performed by using a mixture of $N_2$, $H_2$, and $O_3$ gases as etching gases.

8. A method comprising:
forming a transistor over a substrate, wherein the transistor comprises:
a gate structure;
a source/drain epitaxial structure adjacent to the gate structure;
a contact etch stop layer (CESL) covering the source/drain epitaxial structure; and
a first interlayer dielectric (ILD) layer covering the CESL;
forming a dielectric structure over the substrate, wherein the dielectric structure is in contact with the gate structure and partially embedded in the first ILD layer;
forming a second ILD layer over the transistor and the dielectric structure;
forming a contact opening in the second ILD layer and over the dielectric structure;
performing a first etching process to deepen the contact opening, wherein the first etching process etches the dielectric structure faster than etches the first ILD layer;
performing a second etching process to further deepen the contact opening and expose the source/drain epitaxial structure;
performing a third etching process after performing the second etching process, wherein the third etching process etches the CESL faster than etches the source/drain epitaxial structure; and
forming a source/drain contact in the contact opening.

9. The method of claim 8, wherein the source/drain epitaxial structure has a first facet and a second facet both facing the dielectric structure, after performing the second etching process, a portion of the CESL covers the first facet, and after performing the third etching process, an entirety of the first facet is exposed by the CESL.

10. The method of claim 8, wherein the third etching process is performed by using a gaseous mixture of a fluorine-containing gas and a hydrogen-containing gas.

11. The method of claim 8, wherein the first etching process is performed by using a gaseous mixture of a fluorine-containing gas and a hydrogen-containing gas.

12. The method of claim 8, wherein a hydrogen concentration of a gas mixture used in the first etching process is higher than a hydrogen concentration of a gas mixture used in the second etching process.

13. The method of claim 8, wherein a vertical thickness of a first portion of the source/drain contact directly over the dielectric structure is greater than a vertical thickness of a second portion of the source/drain contact directly over the source/drain epitaxial structure.

14. A method comprising:

forming a dummy gate structure over a channel structure of a substrate;

epitaxially depositing a source/drain structure on a sidewall of the channel structure;

depositing a contact etch stop layer (CESL) to cover the source/drain structure;

depositing an interlayer dielectric (ILD) layer over the CESL and laterally surrounding the dummy gate structure;

replacing the dummy gate structure with a metal gate structure, wherein the metal gate structure extends in a first direction in a top view;

forming a dielectric structure in the ILD layer and in contact with the metal gate structure, wherein the dielectric structure extends in a second direction different from the first direction;

recessing the dielectric structure to form a first recess in the dielectric structure, wherein the first recess is defined by inner sidewalls of the ILD layer;

after recessing the dielectric structure, recessing the ILD layer and the CESL to form a second recess in the ILD layer and the CESL and communicating with the first recess, wherein the second recess exposes the source/ drain structure, and a bottom of the first recess is lower than a bottom of the second recess; and forming a source/drain contact in the first recess and the second recess.

15. The method of claim 14, further comprising:

removing a polymer layer formed on the inner sidewalls of the ILD layer prior to recessing the ILD layer and the CESL.

16. The method of claim 14, wherein after recessing the ILD layer and the CESL, a top surface of the CESL is higher than the bottom of the first recess.

17. The method of claim 14, wherein the first recess is deepened during recessing the ILD layer and the CESL.

18. The method of claim 14, further comprising after recessing the ILD layer and the CESL, removing portions of the ILD layer and the CESL on a sidewall of the source/drain structure.

19. The method of claim 18, wherein a plasma frequency used in removing the portions of the ILD layer and the CESL on the sidewall of the source/drain structure is higher than a plasma frequency used in recessing the ILD layer and the CESL.

20. The method of claim 8, wherein the third etching process is a plasma etching process.

* * * * *